United States Patent
Liu et al.

(10) Patent No.: US 12,501,609 B2
(45) Date of Patent: Dec. 16, 2025

(54) MEMORY DEVICE AND METHOD FOR MANUFACTURING MEMORY DEVICE

(71) Applicant: CHANGXIN MEMORY TECHNOLOGIES, INC., Hefei (CN)

(72) Inventors: Zhongming Liu, Hefei (CN); Yexiao Yu, Hefei (CN); Longyang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 336 days.

(21) Appl. No.: 18/165,381

(22) Filed: Feb. 7, 2023

(65) Prior Publication Data
US 2023/0180460 A1    Jun. 8, 2023

Related U.S. Application Data

(63) Continuation of application No. PCT/CN2022/071305, filed on Jan. 11, 2022.

(30) Foreign Application Priority Data

Oct. 18, 2021    (CN) .......................... 202111209338.4

(51) Int. Cl.
*H10B 12/00*    (2023.01)
(52) U.S. Cl.
CPC ....... *H10B 12/315* (2023.02); *H10B 12/0385* (2023.02); *H10B 12/0387* (2023.02);
(Continued)

(58) Field of Classification Search
CPC .. H10B 12/315; H10B 12/482; H10B 12/373; H10B 12/0387; H10B 12/0385; H10B 12/488
See application file for complete search history.

(56) References Cited

U.S. PATENT DOCUMENTS 5,929,477 A * 7/1999 McAllister Burns, Jr. .................. H10B 41/00 438/386
5,977,579 A * 11/1999 Noble ................ H10B 12/0383 257/302

(Continued)

FOREIGN PATENT DOCUMENTS

| CN | 101140935 A | 3/2008 |
| CN | 109346473 A | 2/2019 |

(Continued)

OTHER PUBLICATIONS

CN first office action in application No. 202111209338.4, mailed on Nov. 3, 2025.

*Primary Examiner* — Mary Ellen Bowman
(74) *Attorney, Agent, or Firm* — Syncoda LLC; Feng Ma

(57) ABSTRACT

A memory device and a method for manufacturing a memory device are provided. The memory device includes: a substrate, and a plurality of first capacitors embedded in the substrate; a plurality of first vertical transistors and a plurality of second vertical transistors, in which the plurality of first vertical transistors and the plurality of second vertical transistors are arranged on the substrate, and in which each of the plurality of first vertical transistors is electrically connected to a respective one of the plurality of first capacitors; and a plurality of second capacitors arranged on the plurality of first vertical transistors and the plurality of second vertical transistors, in which each of the plurality of second capacitors is electrically connected to a respective one of the plurality of second vertical transistors.

17 Claims, 22 Drawing Sheets

(52) U.S. Cl.
CPC ......... *H10B 12/373* (2023.02); *H10B 12/482* (2023.02); *H10B 12/488* (2023.02)

(56) References Cited

U.S. PATENT DOCUMENTS

| | | | | |
|---|---|---|---|---|
| 6,137,128 | A * | 10/2000 | Holmes | ............... H10D 1/665 257/302 |
| 8,324,682 | B2 | 12/2012 | Chen et al. | |
| 9,245,893 | B1 | 1/2016 | Sukekawa | |
| 10,062,745 | B2 * | 8/2018 | Ramaswamy | ....... H10B 12/033 |
| 2003/0082875 | A1 * | 5/2003 | Lee | ..................... H10D 86/01 438/243 |
| 2008/0061340 | A1 | 3/2008 | Heineck et al. | |

FOREIGN PATENT DOCUMENTS

| | | |
|---|---|---|
| CN | 110896074 A | 3/2020 |
| CN | 112885832 A | 6/2021 |

\* cited by examiner

MEMORY DEVICE AND METHOD FOR MANUFACTURING MEMORY DEVICE

CROSS-REFERENCE TO RELATED APPLICATIONS

This is a continuation application of International Patent Application No. PCT/CN2022/071305, filed on Jan. 11, 2022, which claims priority to Chinese Patent Application No. 202111209338.4, filed on Oct. 18, 2021 and entitled "MEMORY DEVICE AND METHOD FOR MANUFACTURING MEMORY DEVICE". The disclosures of International Patent Application No. PCT/CN2022/071305 and Chinese Patent Application No. 202111209338.4 are incorporated by reference herein in their entireties.

BACKGROUND

In a Dynamic Random Access Memory (DRAM), one capacitor and one transistor constitute one memory cell. The transistor is usually arranged in a substrate, the capacitor is usually arranged above the substrate, and the capacitor is electrically connected to the transistor through a node contact.

However, the storage density of the above-mentioned conventional DRAM structure is not high, so that the number of memory cells that can be accommodated per unit area is limited.

SUMMARY

The disclosure relates to the field of semiconductor manufacturing, and in particular to a memory device and a method for manufacturing a memory device.

In view of this, embodiments of the disclosure provide a memory device and a method for manufacturing a memory device, in order to solve at least one problem existing in the background.

The technical solutions of the disclosure are implemented as follows.

The embodiments of the disclosure provide a memory device. The memory device includes: a substrate, and a plurality of first capacitors embedded in the substrate; a plurality of first vertical transistors and a plurality of second vertical transistors, in which the plurality of first vertical transistors and the plurality of second vertical transistors are arranged on the substrate, and in which each of the plurality of first vertical transistors is electrically connected to a respective one of the plurality of first capacitors; and a plurality of second capacitors arranged on the plurality of first vertical transistors and the plurality of second vertical transistors, in which each of the plurality of second capacitors is electrically connected to a respective one of the plurality of second vertical transistors.

The embodiments of the disclosure further provide a method for manufacturing a memory device, which includes the following operations.

A plurality of first capacitors are embedded in a substrate.

A plurality of first vertical transistors and a plurality of second vertical transistors are formed on the substrate, in which each of the plurality of first vertical transistors is electrically connected to a respective one of the plurality of first capacitors.

A plurality of second capacitors are formed on the plurality of first vertical transistors and the plurality of second vertical transistors, in which each of the plurality of second capacitors is electrically connected to a respective one of the plurality of second vertical transistors.

The details of one or more embodiments of the disclosure are set forth in the accompanying drawings and description below. Other features and advantages of the disclosure will become apparent from the specification, the accompanying drawings, and the claims.

BRIEF DESCRIPTION OF THE DRAWINGS

In order to describe the technical solutions in the embodiments of the disclosure more clearly, the accompanying drawings required to be used in the embodiments of the disclosure will be simply introduced below. It is apparent that the accompanying drawings described below show merely some embodiments of the disclosure, and persons of ordinary skill in the art may still derive other drawings from these accompanying drawings without creative effort.

FIG. 2A is a schematic top view of a memory device according to an embodiment of the disclosure, and FIG. 2B is a detailed cross-sectional view of a memory device according to an embodiment of the disclosure taken along the A1-A2 direction in FIG. 2A;

DETAILED DESCRIPTION

Figure 1:
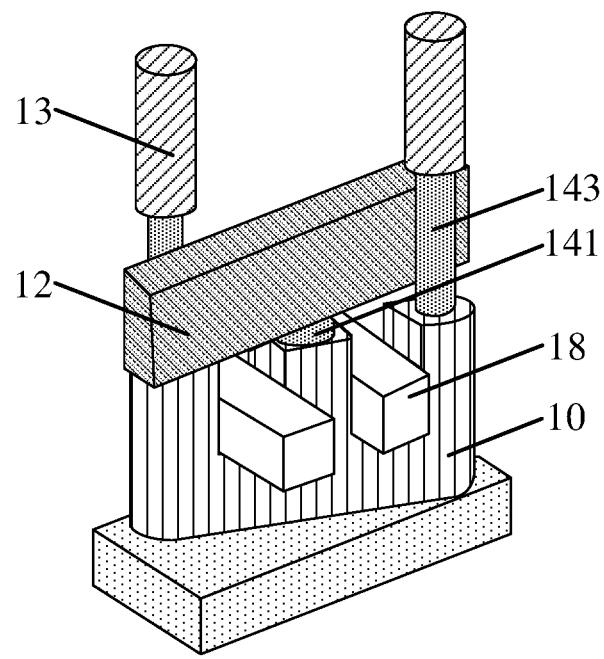
FIG. 1 is a three-dimensional schematic diagram of an exemplary memory device.

Exemplary implementations of the disclosure will be described in more detail below with reference to the accompanying drawings. Although the exemplary implementations of the disclosure are shown in the accompanying drawings, it should be understood that, the disclosure can be implemented in various forms and cannot be limited by the specific implementations illustrated herein. On the contrary, these implementations are provided to more thoroughly understand the disclosure and to completely convey the scope of the disclosure to those skilled in the art.

In the following description, numerous specific details are set forth in other to provide a more thorough understanding of the disclosure. However, it will be apparent to those skilled in the art that the disclosure may be implemented without one or more of these details. In other examples, in other to avoid confusion with the disclosure, some technical features known in the art are not described. That is, all the features of the actual embodiments are not described here, and the well-known functions and structures are not described in detail.

In the accompanying drawings, the size and relative size of layers, regions, and elements may be exaggerated for clarity. The same reference numerals denote the same elements throughout the disclosure.

It should be understood that, when an element or layer is described as being "on", "adjacent to", "connected to", or "coupled to" another element or layer, it may be directly on, adjacent to, connected to, or coupled to the other element or layer, or there may be an intermediate element or layer. On the contrary, when an element is described as being "directly on", "directly adjacent to", "directly connected to" or "directly coupled to" another element or layer, there is no intermediate element or layer. It should be understood that, although the terms "first", "second", "third" and so on may be used to describe various elements, components, regions, layers and/or portions, these elements, components, regions, layers and/or portions should not be limited to these terms. These terms are used only to distinguish an element, component, region, layer or portion from another element, component, region, layer or portion. Therefore, a first element, component, region, layer or portion discussed below may be described as a second element, component, region, layer or portion without departing from the teaching of the disclosure. When the second element, component, region, layer or portion is discussed, it does not mean that the first element, component, region, layer or portion is necessarily present in the disclosure.

Spatial relation terms such as "below", "under", "lower", "beneath", "above", and "on" may be used herein for convenience of description to describe a relationship between an element or feature and another element or feature illustrated in the figures. It should be understood that, in addition to the orientations shown in the figures, the spatial relation terms are intended to include different orientations of devices in use and operation. For example, if the devices in the figures are turned over, then the element or feature described as "under" or "beneath" or "below" another element or feature would then be oriented as "above" the other element or feature. Therefore, the exemplary terms "under" and "below" may include both orientations of above and below. The device may be otherwise oriented (rotated by 90 degrees or in other orientations) and the spatial descriptions used herein may be interpreted accordingly.

The terms used herein are for the purpose of describing specific embodiments only and are not intended to limit the disclosure. As used herein, "a/an", "one", and "the" in singular forms are also intended to include a plural form unless the context clearly indicates other forms. It should also be understood that the terms "consist" and/or "include" when used in the description, determine the presence of the features, integers, steps, operations, elements, and/or components, but do not exclude the presence or addition of one or more other features, integers, steps, operations, elements, components, and/or groups. As used herein, the term "and/or" includes any and all combinations of the related listed items.

In a memory device, such as DRAM, a capacitor is the carrier for storing information, and one capacitor and one transistor form a memory cell. FIG. 1 is a three-dimensional schematic diagram of an exemplary memory device. As shown in FIG. 1, the memory device includes: a substrate 10; a capacitor 13 arranged above the substrate 10, the capacitor 13 being electrically connected to the substrate 10 through a node contact 143; word lines 18 embedded in the substrate 10; and a bit line 12 arranged above the substrate 10 and electrically connected to the substrate 10 through a bit line contact 141.

However, the storage density of the above exemplary memory device is not high, and thus the number of memory cells that can be accommodated per unit area is limited.

Based on this, the following technical solution of the embodiments of the disclosure is proposed.

The embodiment of the disclosure provides a memory device, which includes:
  a substrate, and a plurality of first capacitors embedded in the substrate;
  a plurality of first vertical transistors and a plurality of second vertical transistors, the plurality of first vertical transistors and the plurality of second vertical transistors being arranged on the substrate, and each of the plurality of first vertical transistors being electrically connected to a respective one of the plurality of first capacitors; and
  a plurality of second capacitors arranged on the plurality of first vertical transistors and the plurality of second vertical transistors, each of the plurality of second capacitors being electrically connected to a respective one of the plurality of second vertical transistors.

In the embodiments of the disclosure, the first capacitors and the second capacitors are placed in different spaces, so that the number of capacitors placed per unit area may be increased. Meanwhile, the transistors which are vertically distributed, that is, the first vertical transistors and the second vertical transistors, also increase the number of transistors placed per unit area. Therefore, the memory device provided by the embodiments of the disclosure may effectively increase the number of memory cells placed per unit area, so that the storage density is greatly improved.

In order to make the above objectives, features and advantages of the disclosure more apparent and lucid, the specific implementations of the disclosure are described in detail below with reference to the accompanying drawings. When the embodiments of the disclosure are described in detail, for convenience of description, a schematic diagram may be partially enlarged not according to a general scale, and the schematic diagram is only an example, and should not limit the protection scope of the disclosure herein.

Figure 2A:
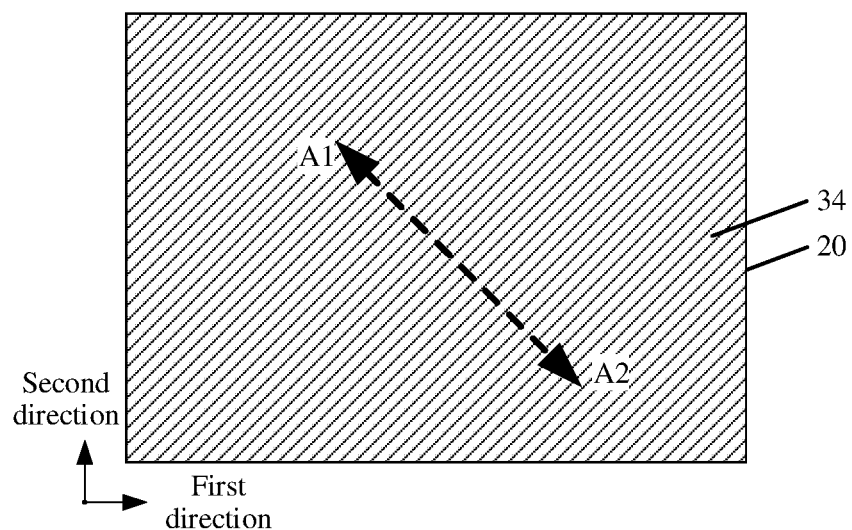
FIG. 2A and FIG. 2B are schematic diagrams of a memory device according to an embodiment of the disclosure.
Figure 2B:
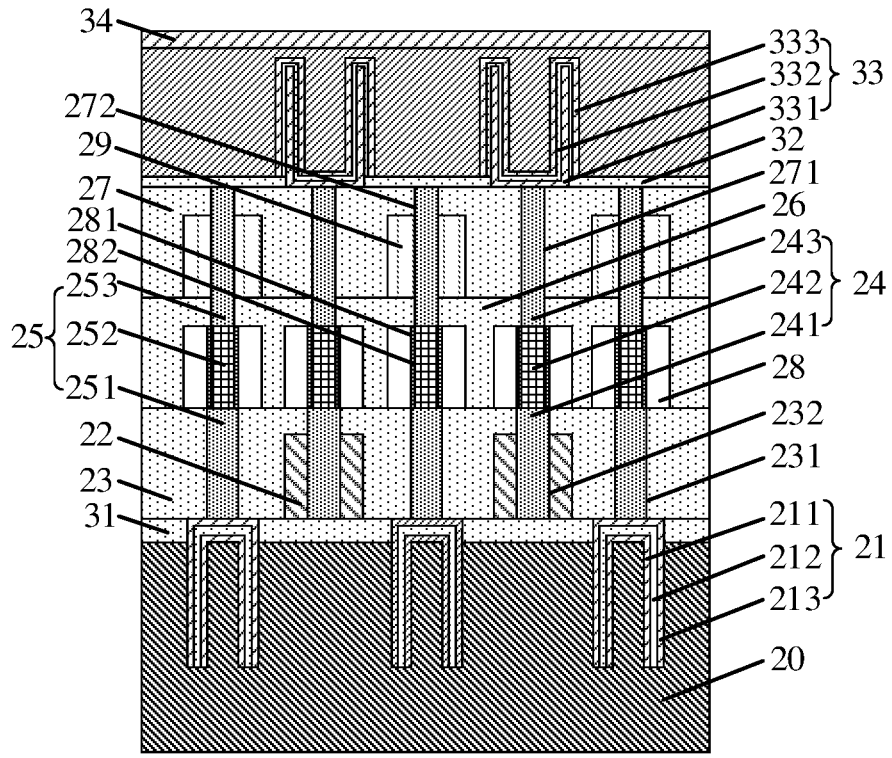

FIG. 2A and FIG. 2B are schematic diagrams of a memory device according to an embodiment of the disclosure. Herein, FIG. 2A is a schematic top view of a memory device according to an embodiment of the disclosure, and FIG. 2B is a detailed cross-sectional view of a memory device according to an embodiment of the disclosure taken along the A1-A2 direction in FIG. 2. As shown in FIG. 2A and FIG. 2B, the memory device includes:
  a substrate 20, and a plurality of first capacitors 21 embedded in the substrate
  a plurality of first vertical transistors 25 and a plurality of second vertical transistors 24, the plurality of first vertical transistors and the plurality of second vertical transistors being arranged on the substrate 20, and each of the plurality of first vertical transistors 25 being electrically connected to a respective one of the plurality of first capacitors 21; and
  a plurality of second capacitors 33 arranged on the plurality of first vertical transistors 25 and the plurality of second vertical transistors 24, each of the plurality of second capacitors 33 being electrically connected to a respective one of the plurality of second vertical transistors 24.

Herein, the substrate may be a semiconductor substrate, and specifically includes at least one elemental semiconductor material (for example, a silicon (Si) substrate, a germanium (Ge) substrate, etc.), at least one III-V compound semiconductor material (for example, a gallium nitride (GaN) substrate, a gallium arsenide (GaAs) substrate, an indium phosphide (InP) substrate, etc.), at least one II-VI compound semiconductor material, at least one organic semiconductor material or other semiconductor materials known in the art. In a specific embodiment, the semiconductor substrate is a P-type silicon substrate.

In one embodiment of the disclosure, the plurality of first capacitors 21 are formed in the substrate 20. Each first capacitor 21 includes a first lower electrode 211, a first dielectric material 212 and a first upper electrode 213. The material of the first lower electrode 211 and the material of the first upper electrode 213 may include one or more conductive materials, such as a doped semiconductor, a conductive metal nitride, metal, a metal silicide, a conductive oxide, or a combination thereof, for example, titanium nitride, tungsten, tantalum nitride, etc.

It can be understood that the material of the first lower electrode 211 may be the same as or different from the material of the first upper electrode 213. The material of the first dielectric material 212 includes, but is not limited to, a nitride, an oxide, a metal oxide, or a combination thereof. For example, silicon nitride, silicon oxide, etc. In some embodiments, a high-K dielectric material may be used to improve the performance of the first capacitor 21.

It should be noted that an insulating isolation layer may be formed between the first lower electrode and the substrate, and/or between the first upper electrode and the substrate according to actual needs.

The first capacitor may be formed through one or more thin film deposition processes. Various thin film deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

With reference to FIG. 2B, each of the plurality of first vertical transistors 25 includes a first source/drain region 251, a channel region 252 and a second source/drain region 253 which are arranged from bottom to top. Similarly, each of the plurality of second vertical transistors 24 also includes a first source/drain region 241, a channel region 242 and a second source/drain region 243 which are arranged from bottom to top.

The first capacitor 21 is electrically connected to the first vertical transistor 25. Specifically, the first capacitor 21 is in direct contact with the first source/drain region 251 of the first vertical transistor 25. Herein, the first capacitor 21 may be directly electrically connected to the first source/drain region 251 of the first vertical transistor 25 without additional node contact, so that the transmission efficiency of stored information may be effectively improved. Meanwhile, the space occupation may be effectively reduced, and the storage density may be improved.

In one embodiment of the disclosure, the memory device further includes a plurality of first bit lines 22 extending in a first direction. Each of the plurality of first bit lines 22 is arranged on the substrate and arranged around the first source/drain region 241 of a respective one of the plurality of second vertical transistors 24. In some specific embodiments, the first bit line 22 may include a polysilicon layer, an anti-diffusion barrier layer and a metal layer, which are stacked on one another from bottom to top. Optionally, the first bit line 22 may also include a bit line covering layer, a spacer structure, etc.

With reference to FIG. 2B, the memory device further includes: a first insulating layer 23, a plurality of first through holes 231, and a plurality of second through holes 232. The first insulating layer is arranged between the plurality of first bit lines 22 and covers the plurality of first bit lines 22. The plurality of first through holes are arranged between the plurality of first bit lines 22 and penetrate through the first insulating layer 23, and the first source/drain regions 251 of each of the plurality of first vertical transistors 25 is provided in a respective one of the plurality of first through holes 231. Each of the plurality of second through holes penetrates through the first insulating layer 23 and a respective one of the plurality of first bit lines 22, and the first source/drain region 241 of each of the plurality of second vertical transistors 24 is provided in a respective one of the plurality of second through holes 232. The material of the first insulating layer 23 includes, but is not limited to, silicon oxide, silicon nitride, silicon carbide, silicon oxynitride, etc.

As can be seen from FIG. 2B, the first bit line 22 is arranged around the first source/drain region 241 of the second vertical transistor 24. That is, the first source/drain region 241 of the second vertical transistor 24 is in direct contact with the first bit line 22. The electrical connection can be achieved without bit line contact, which may effectively reduce the space occupation and improve the storage density.

In some embodiments, the first source/drain regions 251 and 241 may be doped semiconductor materials. Specifically, the doped semiconductor material may include, but is not limited to, an N-type polysilicon material, a P-type polysilicon material, etc.

The formation process of the first source/drain regions 251 and 241 may be an epitaxial growth process. Optionally, the doping of the first source/drain regions 251 and 241 may be performed during the epitaxial growth or after the epitaxial growth is completed.

In an embodiment, the memory device further includes a first dielectric layer 31. The first dielectric layer 31 is arranged between the first bit lines 22 and the substrate 20. The material of the first dielectric layer 31 may be the same as or different from the material of the first insulating layer 23. Specifically, the material of the first dielectric layer 31 includes, but is not limited to, silicon oxide, silicon nitride, silicon carbide, silicon oxynitride, etc.

With reference to FIG. 2A and FIG. 2B, the memory device further includes a plurality of word lines 28 arranged above the plurality of first bit lines 22 and extending in a second direction. Each of the plurality of word lines 28 is provided with a plurality of third through holes 281. The channel region 252 of each of the plurality of first vertical transistors 25 is provided in a respective one of the plurality of third through holes 281, and the channel region 242 of each of the plurality of second vertical transistors 24 is provided in a respective one of the plurality of third through holes 281. It can be understood that the doping type of the channel regions 252 and 242 is different from the doping type of the first source/drain regions 251 and 241. The channel region 252 of the first vertical transistor 25 is in direct contact with the first source/drain region 251 of the first vertical transistor 25, and the channel region 242 of the second vertical transistor 24 is in direct contact with the first source/drain region 241 of the second vertical transistor 24.

It can be understood that an inner sidewall of each third through hole 281 is also covered with a gate dielectric layer 282. The gate dielectric layer 282 is arranged between the third through hole 281 and the channel regions 252 and 242. That is, the gate dielectric layer 282 is formed between the word line 28 and the channel regions 252 and 242, so as to provide electrical insulation. Herein, the material for forming the gate dielectric layer 282 may be the same as the material for forming the first insulating layer 23, which is not repeated herein.

In one embodiment of the disclosure, the memory device further includes a plurality of second bit lines 29 extending in the first direction. The plurality of second bit lines 29 are arranged above the plurality of word lines 28, and each of the plurality of second bit lines is arranged around the second source/drain region 253 of a respective one of the plurality of first vertical transistors 25. The second bit line 29 is electrically connected to the first capacitor 21 through the first vertical transistor 25. Herein, the second bit line 29 is in direct contact with the second source/drain region 253 of the first vertical transistor 25. Thus, the electrical connection can be achieved without bit line contact, which may effectively reduce the space occupation and improve the storage density.

In some specific embodiments, the memory device further includes: a second insulating layer 26, a third insulating layer 27, a plurality of fourth through holes 271, and a plurality of fifth through holes 272. The second insulating layer is arranged between the plurality of word lines 28 and covers the plurality of word lines 28. The third insulating layer is arranged between the plurality of second bit lines 29 and covers the plurality of second bit lines 29. Each of the plurality of fourth through hole is arranged between two adjacent second bit lines 29 of the plurality of second bit lines 29, and penetrates through the third insulating layer 27 and the second insulating layer 26 to expose the channel region 242 of each of the plurality of second vertical transistors 24. The second source/drain region 243 of each of the plurality of second vertical transistors 24 is provided in a respective one of the plurality of fourth through holes 271. Each of the plurality of fifth through holes 272 penetrates through the third insulating layer 27, a respective one of the plurality of second bit lines 29 and the second insulating layer 26, so as to expose the channel region 252 of each of the plurality of first vertical transistors 25. The second source/drain region 253 of each of the plurality of first vertical transistors 25 is provided in a respective one of the plurality of fifth through holes 272. Herein, the second source/drain region 243 of the second vertical transistor 24 is in direct contact with the channel region 242 of the second vertical transistor 24, and the second source/drain region 253 of the first vertical transistor 25 is in direct contact with the channel region 252 of the first vertical transistor 25.

It can be understood that the conductive type of the second source/drain regions 243 and 253 is the same as the conductive type of the first source/drain regions 241 and 251. The second source/drain regions 243 and 253 are formed in the same way as the first source/drain regions 241 and 251, which is not repeated herein.

With reference to FIG. 2B, each second capacitor 33 includes a second lower electrode 331, a second dielectric material 332 and a second upper electrode 333. The materials of the second lower electrode 331 and the second upper electrode 333 may include one or more conductive materials, such as a doped semiconductor, a conductive metal nitride, metal, a metal silicide, a conductive oxide, or a combination thereof. For example, titanium nitride, tungsten, tantalum nitride, etc.

It can be understood that the material of the second lower electrode 331 may be the same as or different from the material of the second upper electrode 333. The material of the second dielectric material 332 includes a nitride, an oxide, a metal oxide, or a combination thereof. For example, silicon nitride, silicon oxide, etc. In some embodiments, a high-K dielectric material may be used to improve the performance of the second capacitor 33.

As shown in FIG. 2B, it can be seen that the second capacitor 33 is in direct contact with the second source/drain region 243 of the second vertical transistor 24, and the second capacitor 33 is electrically connected to the first bit line 22 through the second vertical transistor 24. Herein, the second capacitor 33 may be directly electrically connected to the second source/drain region 243 of the second vertical transistor 24 without additional node contact, so that the transmission efficiency of stored information may be effectively improved. Meanwhile, the space occupation may be effectively reduced, and the storage density may be improved.

The memory device further includes a second dielectric layer 32 arranged between the second capacitors 33 and the third insulating layer 27. The second dielectric layer 32 is configured to provide electrical isolation between the second capacitor 33 and the second source/drain region 253 of the first vertical transistor 25. Herein, the material for forming the second dielectric layer 32 includes, but is not limited to, silicon oxide, silicon nitride, silicon carbide, silicon oxynitride, etc.

Optionally, a plate layer 34 may also be formed above the plurality of second capacitors 33. The material of the plate layer 34 includes, but is not limited to, titanium nitride, etc.

In the embodiments of the disclosure, the second capacitors are arranged above the substrate, and the first capacitors are embedded in the substrate. The first capacitors and the second capacitors are arranged in different spaces, so that the arrangement of the first capacitors and the arrangement of the second capacitors do not interfere with each other. In some embodiments of the disclosure, the projections of the first capacitors on the substrate may partially overlap the projections of the second capacitors on the substrate. In this case, the vertical transistors arranged between the first capacitors and the second capacitors may be arranged more compactly. Thus, the number of memory cells per unit area of the memory device may be increased, so that the storage density is improved.

In addition, in the embodiments of the disclosure, the first vertical transistors and the second vertical transistors are vertically distributed, and the first vertical transistor is in direct contact with the first capacitor and the second bit line, and the second vertical transistor is in direct contact with the second capacitor and the first bit line, so that the bit line contact and the node contact are omitted. Thus, the transmission rate of stored information may be improved. Meanwhile, the space for a single memory cell may also be reduced, so that the storage density of the memory device is further improved.

Figure 3:
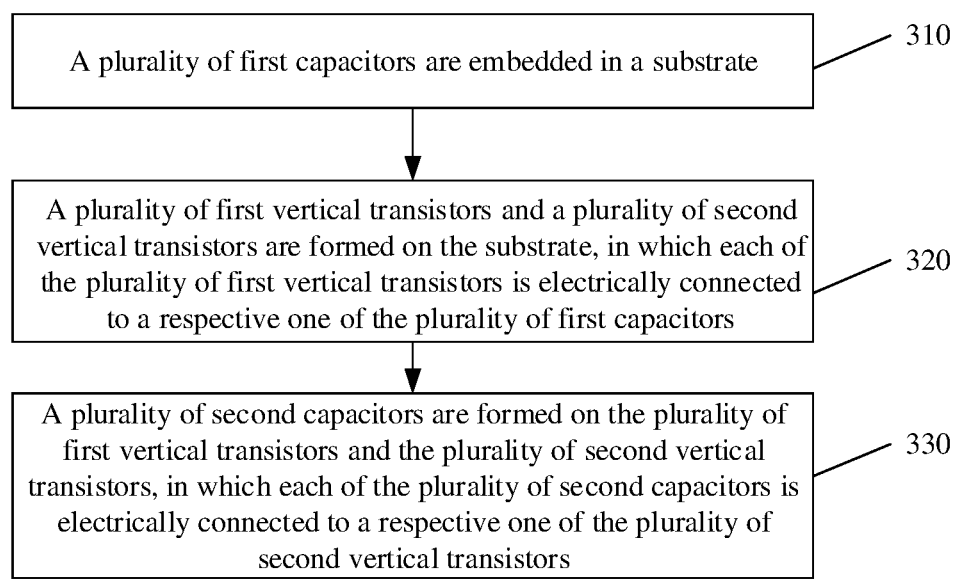
FIG. 3 is a flowchart of a method for manufacturing a memory device according to an embodiment of the disclosure.

The embodiment of the disclosure further provides a method for manufacturing a memory device, with referenced to FIG. 3. As shown in FIG. 3, the method includes the following operations.

In S310, a plurality of first capacitors are embedded in a substrate.

In S320, a plurality of first vertical transistors and a plurality of second vertical transistors are formed on the substrate, in which each of the plurality of first vertical transistors is electrically connected to a respective one of the plurality of first capacitors.

In S330, a plurality of second capacitors are formed on the plurality of first vertical transistors and the plurality of second vertical transistors, in which each of the plurality of second capacitors is electrically connected to a respective one of the plurality of second vertical transistors.

Hereinafter, the method for manufacturing the memory device provided in the embodiment of the disclosure is further described in detail with reference to FIG. 4A to FIG. 22B. Herein, FIG. 4A to FIG. 22A are schematic top views of a memory device according to an embodiment of the disclosure in a manufacturing process; and FIG. 4B to FIG. 22B are detailed cross-sectional views of a memory device according to an embodiment of the disclosure in a manufacturing process taken along the A1-A2 direction in FIG. 4A to FIG. 22A.

Figure 4A:
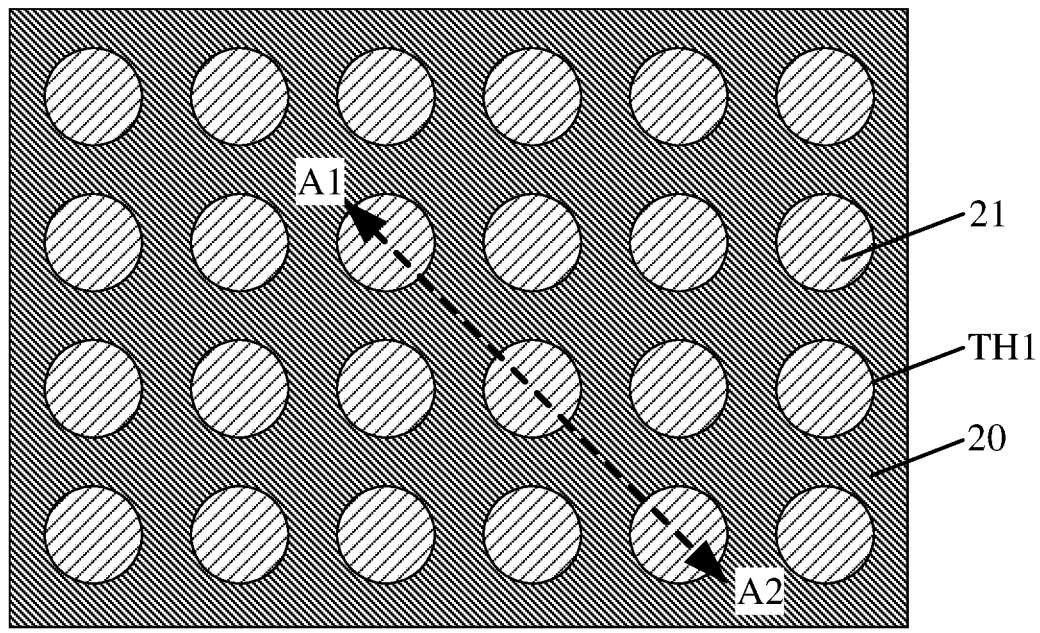
FIG. 4A-4B, FIG. 5A-5B, FIG. 6A-6B, FIG. 7A-7B, FIG. 8A-8B, FIG. 9A-9B, FIG. 10A-10B, FIG. 11A-11B, FIG. 12A-12B, FIG. 13A-13B, FIG. 14A-14B, FIG. 15A-15B, FIG. 16A-16B, FIG. 17A-17B, FIG. 18A-18B, FIG. 19A-19B, FIG. 20A-20B, FIG. 21A-21B, FIG. 22A-22B are process flowcharts of a method for manufacturing a memory device according to an embodiment of the disclosure.
Figure 4B:
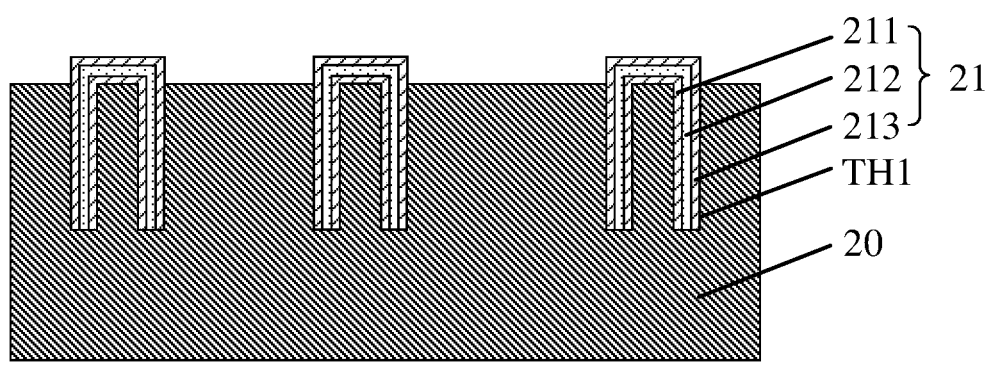

Firstly, as shown in FIG. 4A and FIG. 4B, S310 is executed, in which a plurality of first capacitors 21 are embedded in a substrate 20. Specifically, the operation that the plurality of first capacitors 21 are formed in the substrate 20 includes the following operations. A plurality of first trenches TH1 are formed in the substrate 20. The first trench TH1 may be an annular trench. Next, a first lower electrode 211 is formed in each of the plurality of first trenches TH1. Then, a first dielectric material 212 is formed on the first lower electrode 211, in which the first dielectric material 212 covers the first lower electrode 211. Finally, a first upper electrode 213 is formed on the first dielectric material 212.

In the actual process, the substrate may be a semiconductor substrate. Specifically, the substrate may be a P-type silicon substrate.

The materials of the first lower electrode 211 and the first upper electrode 213 may include one or more conductive materials, such as a doped semiconductor, a conductive metal nitride, metal, a metal silicide, a conductive oxide, or a combination thereof. For example, titanium nitride, tungsten, tantalum nitride, etc. It can be understood that the material of the first lower electrode 211 may be the same as or different from the material of the first upper electrode 213. The material of the first dielectric material 212 includes a nitride, an oxide, a metal oxide, or a combination thereof. For example, silicon nitride, silicon oxide, etc. In some embodiments, a high-K dielectric material may be used to improve the performance of the first capacitor 21.

The first capacitor may be formed through one or more thin film deposition processes. Various thin film deposition processes include, but are not limited to, a Chemical Vapor Deposition (CVD) process, a Plasma Enhanced Chemical Vapor Deposition (PECVD) process, an Atomic Layer Deposition (ALD) process, or a combination thereof.

It should be noted that an insulating isolation layer may be formed between the first lower electrode and the substrate, and/or between the first upper electrode and the substrate, according to actual needs.

Next, S320 is executed. As shown in FIG. 5A to FIG. 16B, a plurality of first vertical transistors 25 and a plurality of second vertical transistors 24 are formed on the substrate 20. Herein, each of the plurality of first vertical transistors 25 is electrically connected to a respective one of the plurality of first capacitors 21.

Figure 5A:
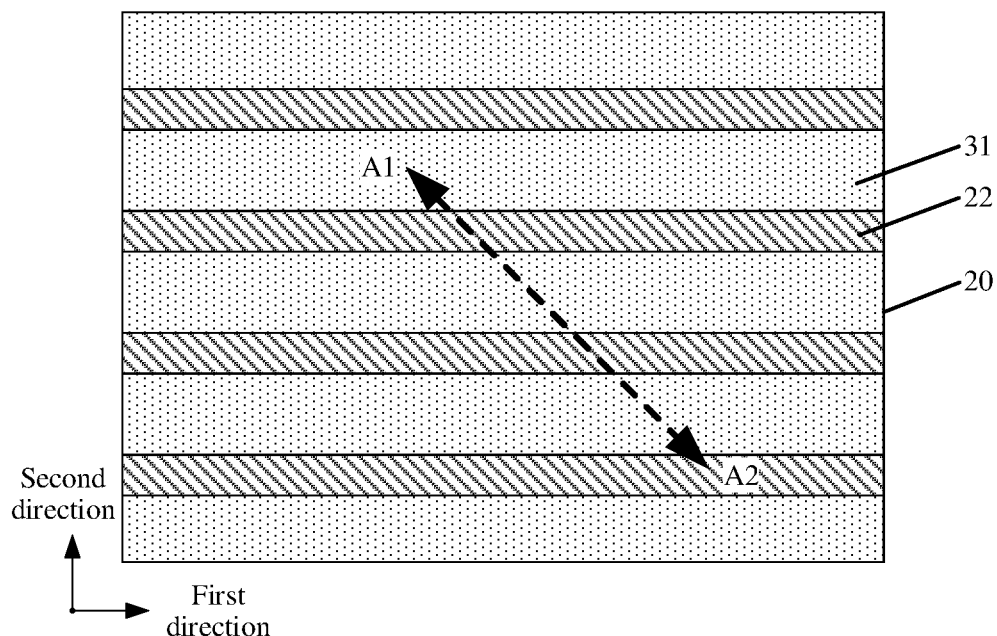
Figure 5B:
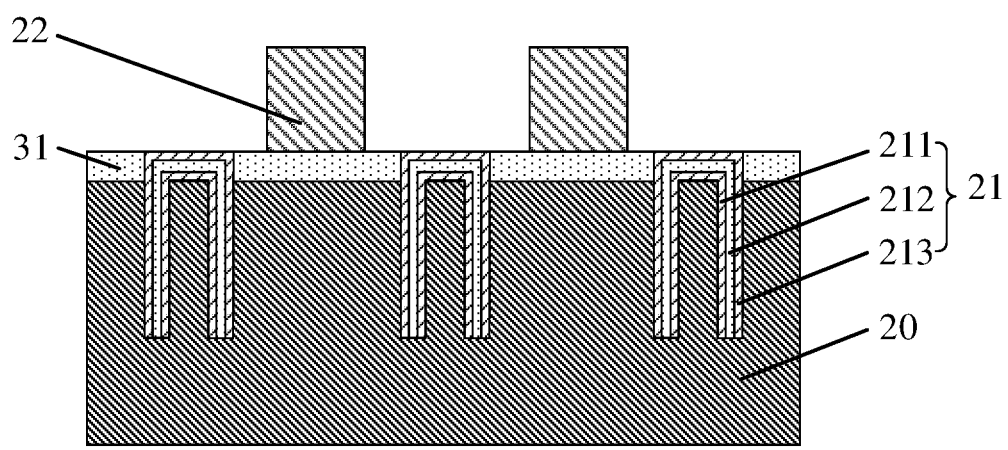

In one embodiment, as shown in FIG. 5A and FIG. 5B, before the plurality of first vertical transistors 25 and the plurality of second vertical transistors 24 are formed on the substrate 20, the method further includes the following operation. A plurality of first bit lines 22 extending in a first direction are formed on the substrate 20. Each first bit line 22 may include a polysilicon layer, an anti-diffusion barrier layer, and a metal layer, which are stacked on one another from bottom to top. Optionally, the first bit line 22 may further include a bit line covering layer, a spacer structure, etc.

In the actual process, before the first bit lines 22 are formed, a first dielectric layer 31 may firstly be formed on the substrate 20. The first dielectric layer 31 is configured to electrically isolate the first bit lines 22 from the first capacitors 21. Herein, the material for forming the first dielectric layer 31 includes, but is not limited to, silicon oxide, silicon nitride, silicon carbide, silicon oxynitride, etc.

In one embodiment, the operation that the plurality of first vertical transistors 25 and the plurality of second vertical transistors 24 are formed on the substrate 20 includes the following operations.

Firstly, with reference to FIG. 6A to FIG. 8B, a first source/drain region 251 of each of the plurality of first vertical transistors 25 and a first source/drain region 241 of each of the plurality of second vertical transistors 24 are formed on the substrate 20. The first source/drain region 251 of each of the plurality of first vertical transistors 25 is electrically connected to the respective one of the plurality of first capacitors 21, and the first source/drain region 241 of each of the plurality of second vertical transistors 24 is electrically connected to a respective one of the plurality of first bit lines 22.

Then, with reference to FIG. 10A to FIG. 11B, a channel region 252 is formed on the first source/drain region 251 of each of the plurality of first vertical transistors 25, and a channel region 242 is formed on the first source/drain region 241 of each of the plurality of second vertical transistors 24.

Finally, with reference to FIG. 14A to FIG. 16B, a second source/drain region 253 is formed on the channel region 252 of each of the plurality of first vertical transistors 25, and a second source/drain region 243 is formed on the channel region 242 of each of the plurality of second vertical transistors 24.

In a specific embodiment, with reference to FIG. 6A to FIG. 8B, the operation that the first source/drain region 251 of each of the plurality of first vertical transistors 25 and the first source/drain region 241 of each of the plurality of second vertical transistors 24 are formed on the substrate 20 includes the following operations.

Figure 6A:
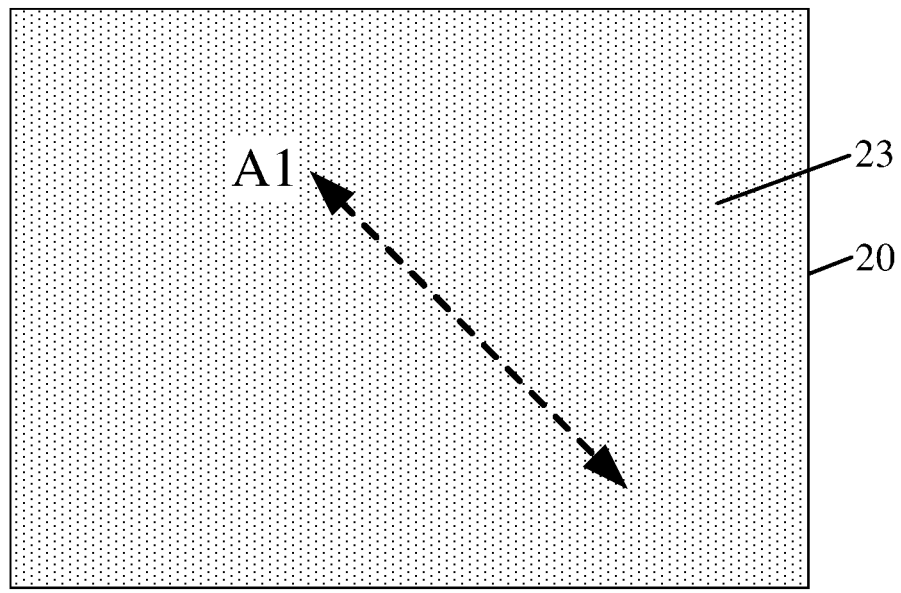
Figure 6B:
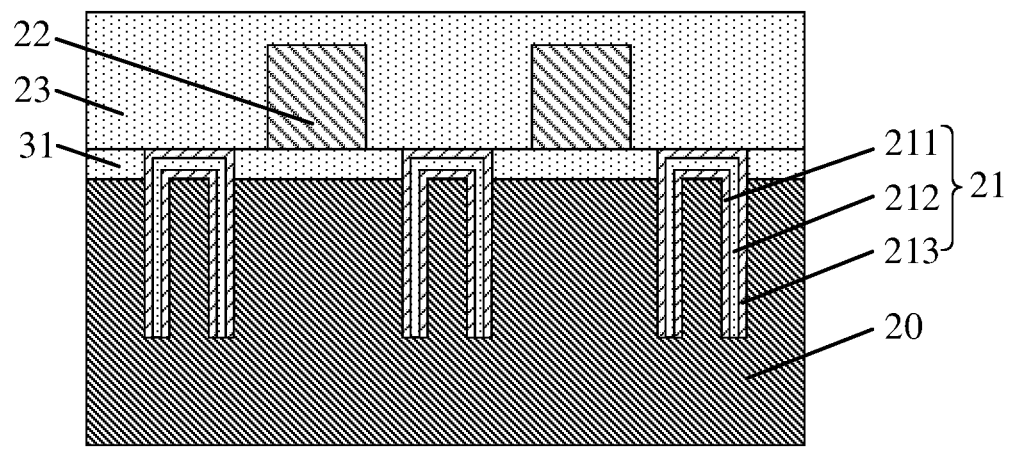

A first insulating layer 23 is formed between the plurality of first bit lines 22 and above the plurality of first bit lines 22, as shown in FIG. 6A and FIG. 6B.

Figure 7A:
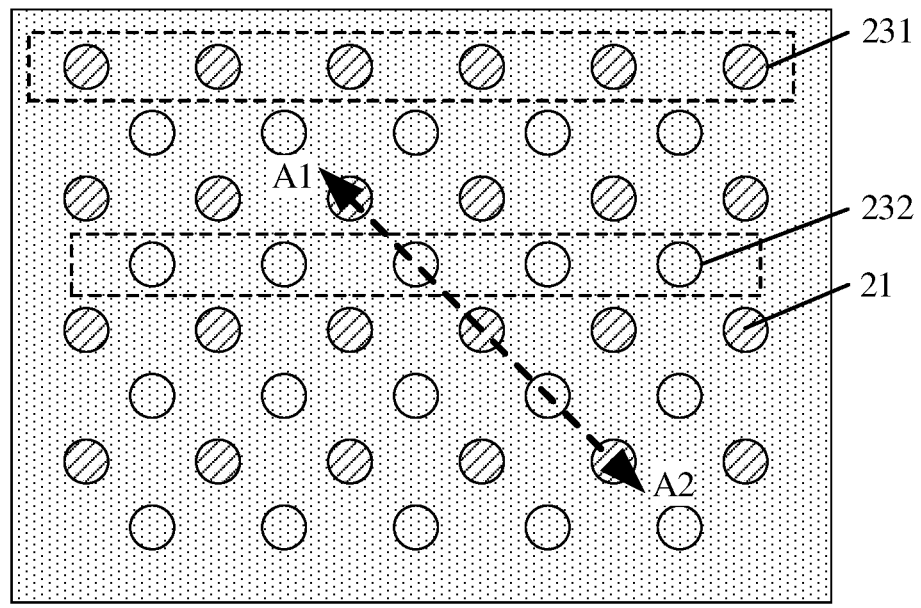
Figure 7B:
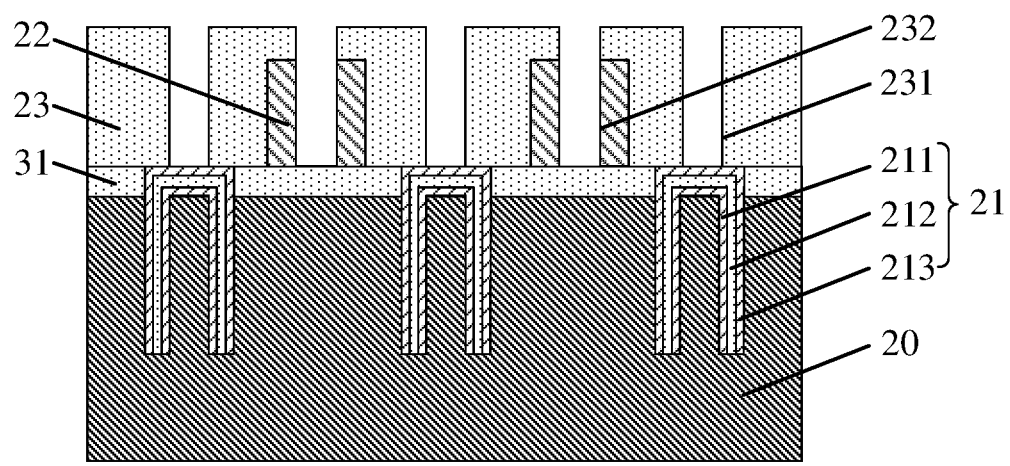

The first insulating layer 23 arranged between the plurality of first bit lines 22 is etched to form a plurality of first through holes 231, in which each of the plurality of first capacitors 21 is exposed by a respective one of the plurality of first through holes 231. The first insulating layer 23 and the plurality of first bit lines 22 arranged below the first insulating layer 23 are etched to form a plurality of second through holes 232, as shown in FIG. 7A and FIG. 7B.

Figure 8A:
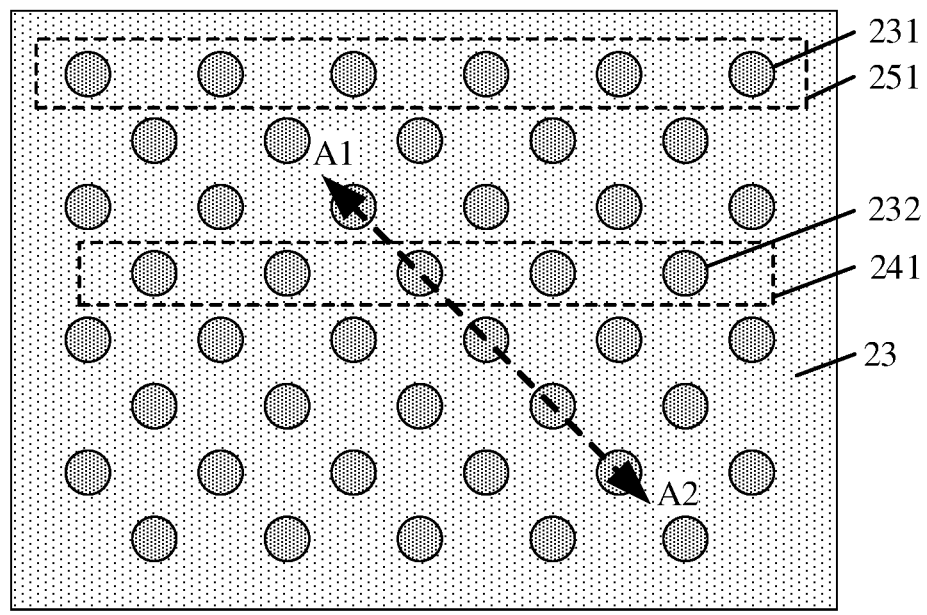
Figure 8B:
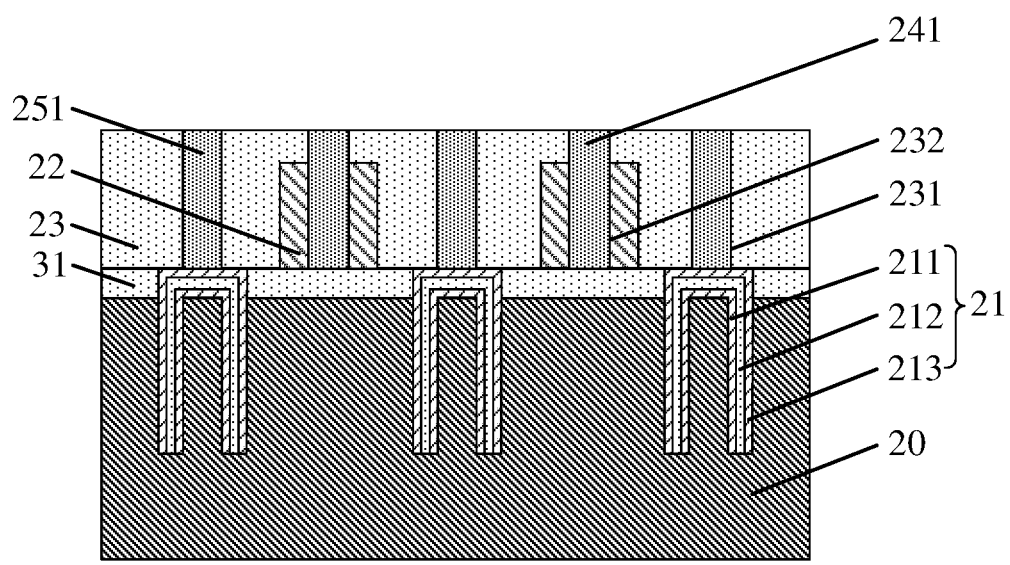

The first source/drain region 251 of each of the plurality of first vertical transistors 25 is formed in a respective one of the plurality of first through holes 231, and the first source/drain region 241 of each of the plurality of second vertical transistors 24 is formed in a respective one of the plurality of second through holes 232, as shown in FIG. 8A and FIG. 8B.

The material of the first insulating layer 23 includes, but is not limited to, silicon oxide, silicon nitride, silicon carbide, silicon oxynitride, etc.

In some embodiments, the formation process of the first through holes 231 and the second through holes 232 by etching may be a dry etching process.

The first source/drain regions 251 and 241 may be doped semiconductor materials. Specifically, the doped semiconductor material may include, but is not limited to, an N-type polysilicon material, a P-type polysilicon material, etc. The formation process of the first source/drain regions 251 and 241 may be an epitaxial growth process. Optionally, the doping of the first source/drain regions 251 and 241 may be performed during the epitaxial growth or after the epitaxial growth is completed.

The first capacitor 21 is electrically connected to the first vertical transistor 25. Specifically, the first capacitor 21 is in direct contact with the first source/drain region 251 of the first vertical transistor 25. Herein, the first capacitor 21 may be directly electrically connected to the first source/drain region 251 of the first vertical transistor 25 without additional node contact, so that the transmission efficiency of stored information may be effectively improved. Meanwhile, the space occupation may be effectively reduced, and the storage density may be improved.

In addition, the first bit line 22 is arranged around the first source/drain region 241 of the second vertical transistor 24. That is, the first source/drain region 241 of the second vertical transistor 24 is in direct contact with the first bit line 22. Thus, the electrical connection may be achieved without bit line contact, which may effectively reduce the space occupation, and improve the storage density.

Figure 9A:
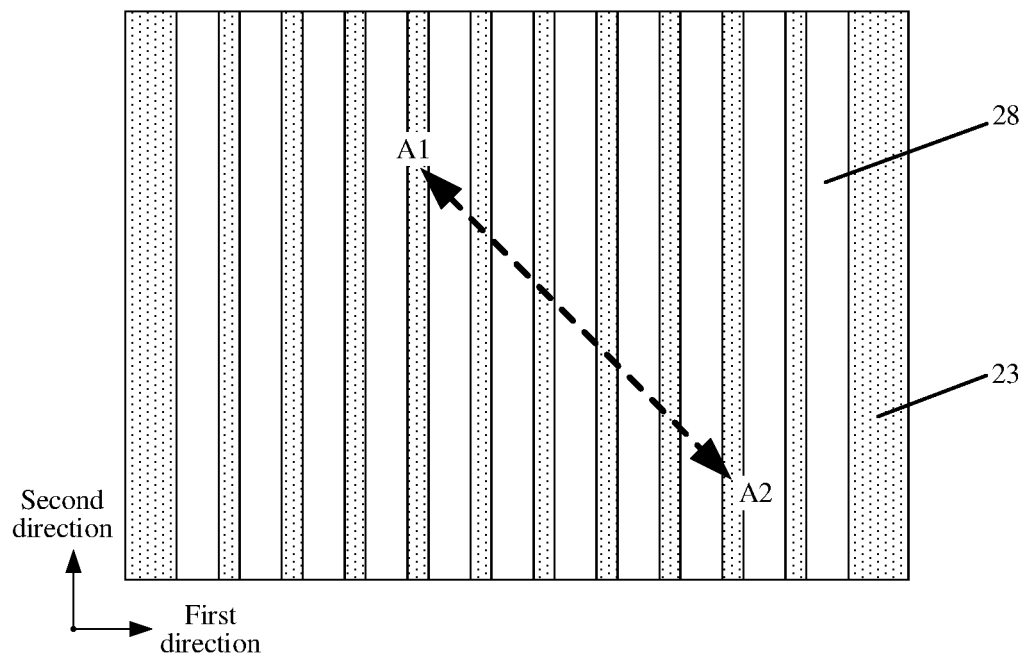
Figure 9B:
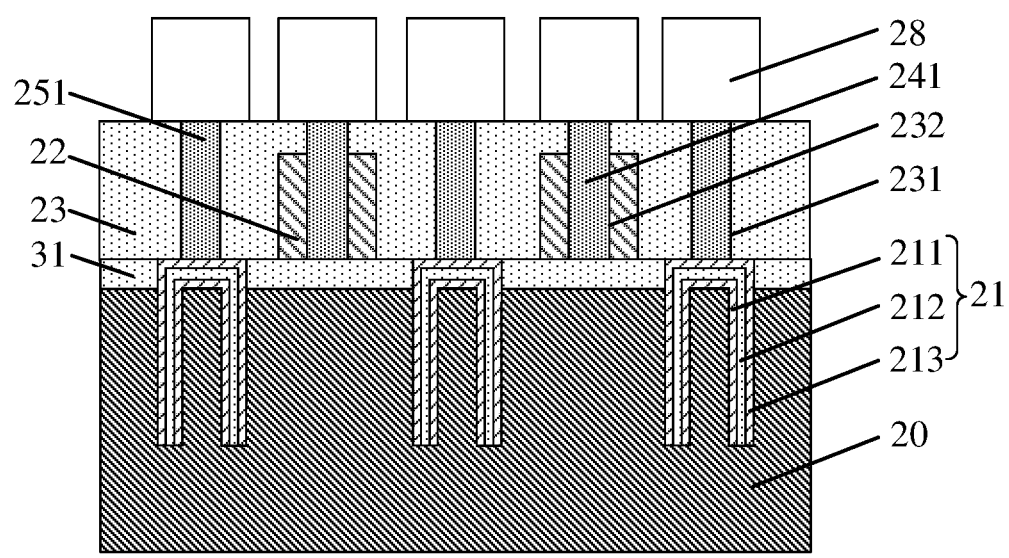

In a specific embodiment, with reference to FIG. 9A and FIG. 9B, before the channel region 252 of each of the plurality of first vertical transistors 25 and the channel region 242 of each of the plurality of second vertical transistors 24 are formed, the method includes the following operations.

A plurality of word lines 28 extending in a second direction are formed above the first insulating layer 23, in which the first source/drain region 251 of each of the plurality of first vertical transistors 25 is covered with a respective one of the plurality of word lines 28, and the first source/drain region 241 of each of the plurality of second vertical transistors 24 is covered with a respective one of the plurality of word lines 28.

Figure 23:
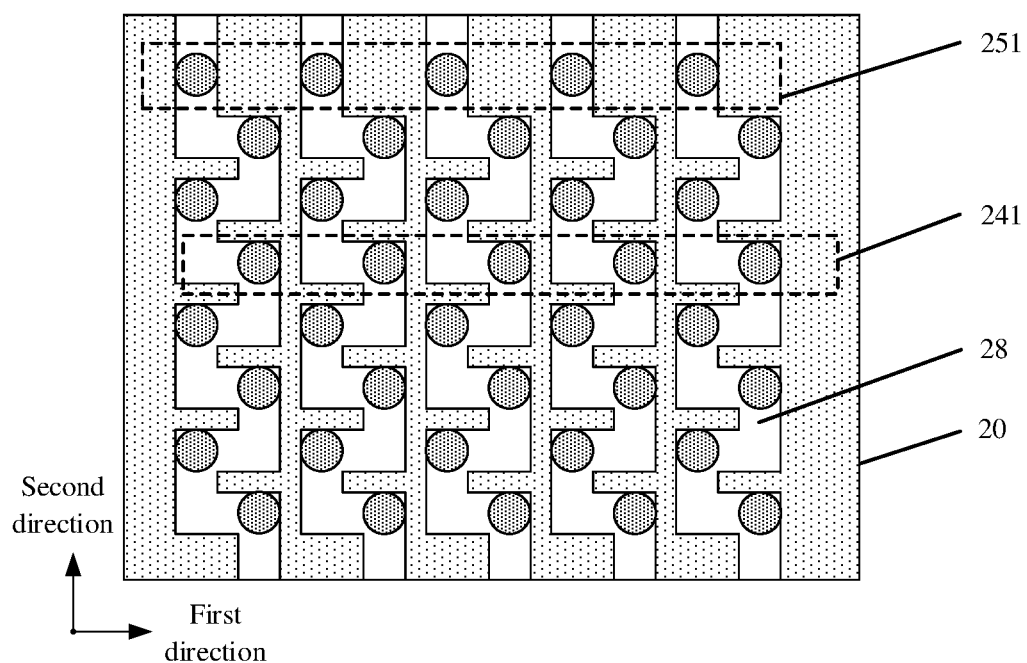
FIG. 23 is a schematic top view of a method for manufacturing a memory device according to another embodiment of the disclosure.

As shown in FIG. 9A, the word line may extend in the second direction in a straight line, which is not limited thereto. In some embodiments, the word line may also extend in the second direction in a curve. Specifically, as shown in FIG. 23, the word line may also extend in the second direction in an "arch" shape, which is not limited thereto. The word line may also extend in the second direction in a wavy or "zigzag" shape. As can be seen from FIG. 23, the "arch"-shaped word line may simultaneously control the turn-on of two adjacent columns of vertical transistors. Compared with the linear word line shown in FIG. 9A, the number of the "arch"-shaped word lines is only half of the number of the linear word lines.

In some specific embodiments, the operation that the channel region 252 of each of the plurality of first vertical transistors 25 and the channel region 242 of each of the plurality of second vertical transistors 24 are formed includes the following operations.

Figure 10A:
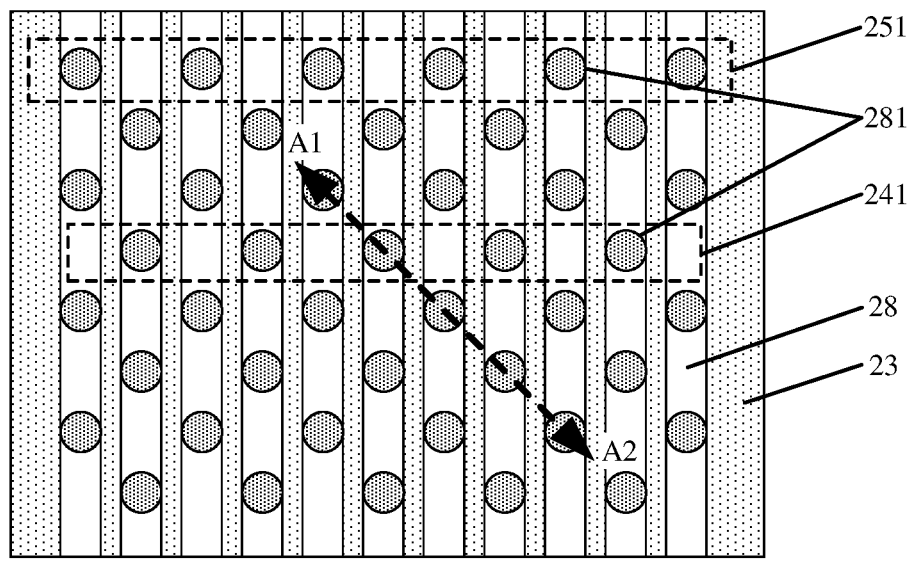
Figure 10B:
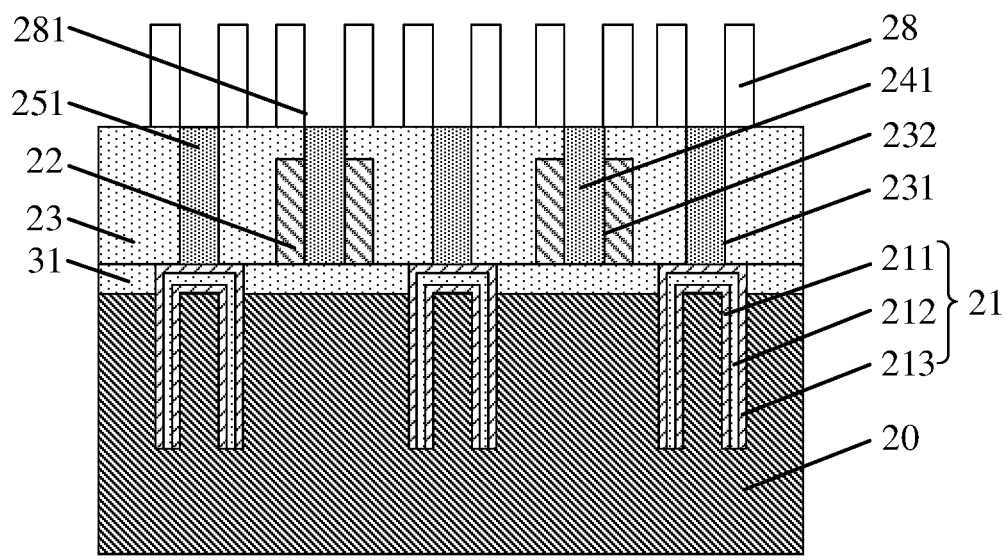

The plurality of word lines 28 are etched to form a plurality of third through holes 281 in the word lines 28, as shown in FIG. 10A and FIG. 10B. In the actual process, the etching process may be a dry etching process.

Figure 11A:
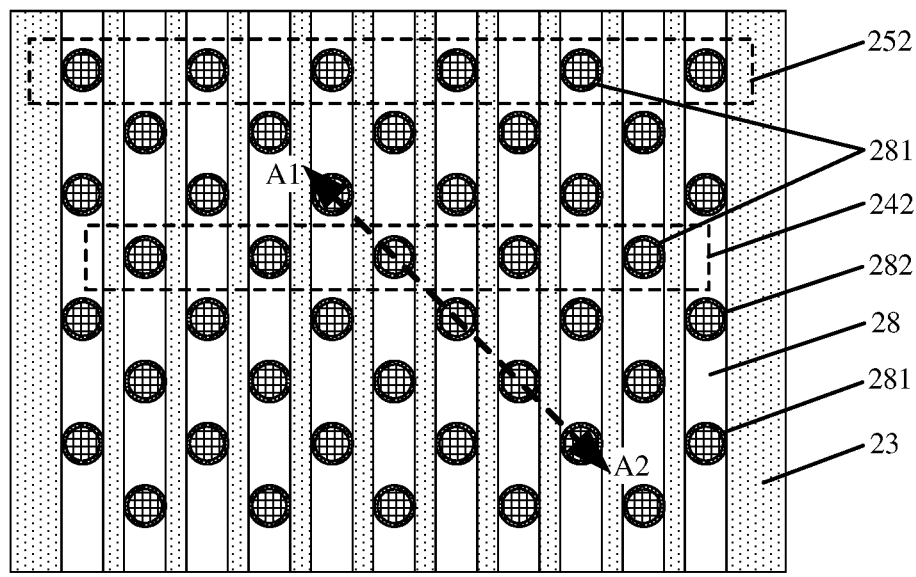
Figure 11B:
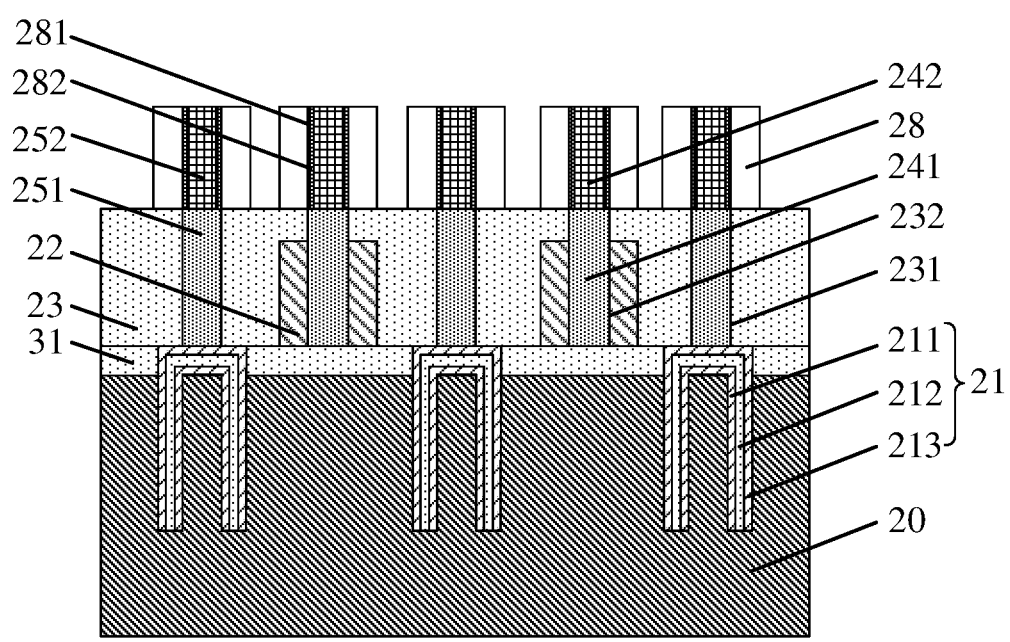

Then, the channel region 252 of each of the plurality of first vertical transistors 25 is formed in a respective one of the plurality of third through holes 281, and the channel region 242 of each of the plurality of second vertical transistors 24 is formed in a respective one of the plurality of third through holes 281, as shown in FIG. 11A and FIG. 11B. Optionally, the materials of the channel regions 252 and 242 may be doped semiconductor materials, such as a P-type polysilicon material.

Herein, the third through hole 281 exposes the first source/drain region 251 of the first vertical transistor 25 and the first source/drain region 241 of the second vertical transistor 24, respectively, so that the channel region 252 of the first vertical transistor 25 finally formed is in direct contact with the first source/drain region 251 of the first vertical transistor 25, so as to form an electrical connection. The channel region 242 of the second vertical transistor 24 is in direct contact with the first source/drain region 241 of the second vertical transistor 24, so as to form an electrical connection.

It can be understood that, with reference to FIG. 11A and FIG. 11B, before the channel region 252 of each of the plurality of first vertical transistors 25 and the channel region 242 of each of the plurality of second vertical transistors 24 are formed, the method further includes the following operation. A gate dielectric layer 282 is formed on a sidewall of each of the plurality of third through holes 281. The gate dielectric layer 282 is arranged between the third through hole 281 and the channel regions 252 and 242. That is, the gate dielectric layer 282 is formed between the word line 28 and the channel regions 252 and 242, so as to provide the electrical insulation. Herein, the material for forming the gate dielectric layer 282 may be the same as the material for forming the first insulating layer 23, which is not repeated herein.

With reference to FIG. 12A to FIG. 13B, before the second source/drain region 253 of each of the plurality of first vertical transistors 25 and the second source/drain region 243 of each of the plurality of second vertical transistors 24 are formed, the method further includes the following operations.

Figure 12A:
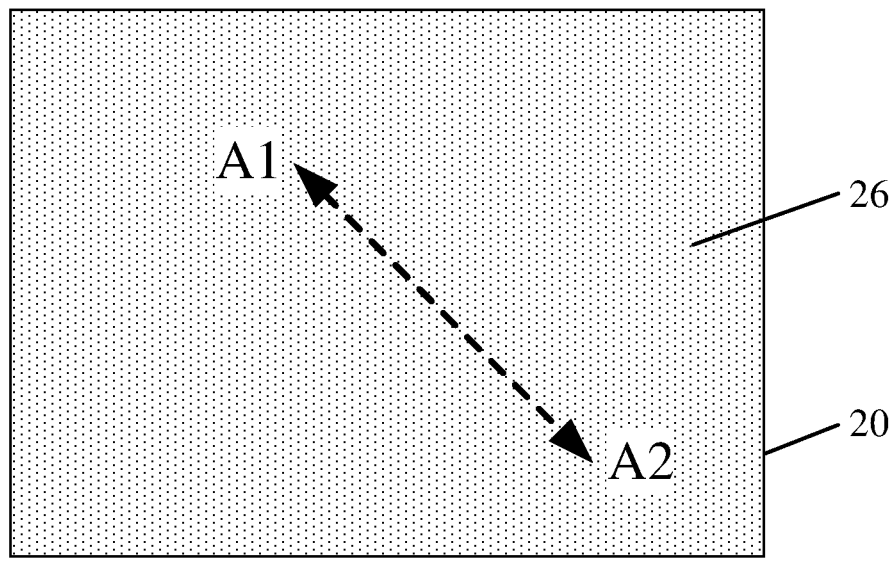
Figure 12B:
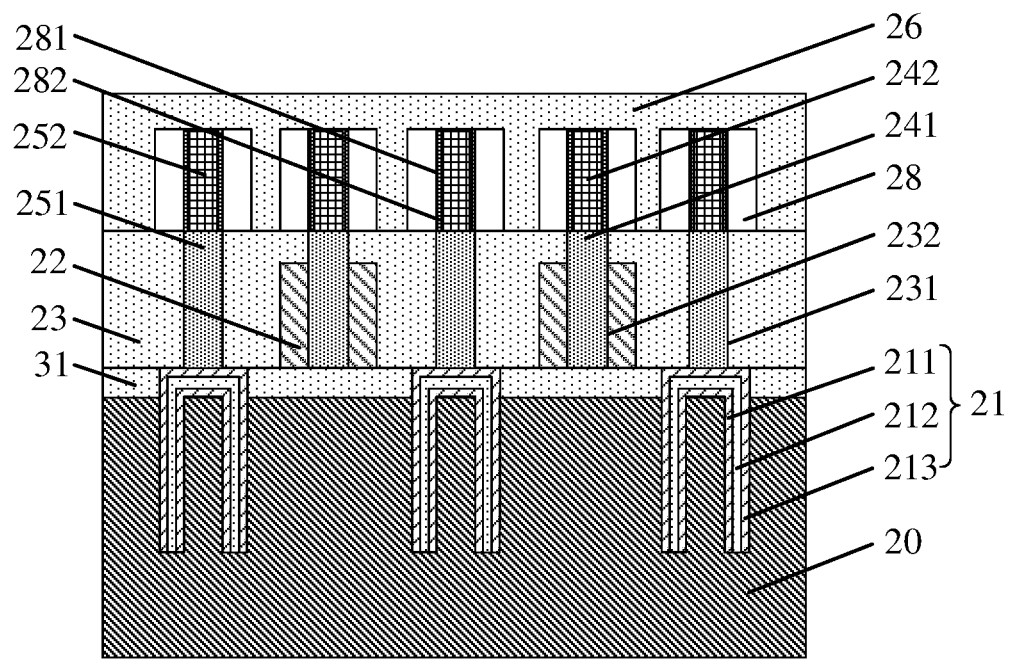

A second insulating layer 26 is formed between the plurality of word lines 28 and above the plurality of word lines 28, as shown in FIG. 12A and FIG. 12B.

Figure 13A:
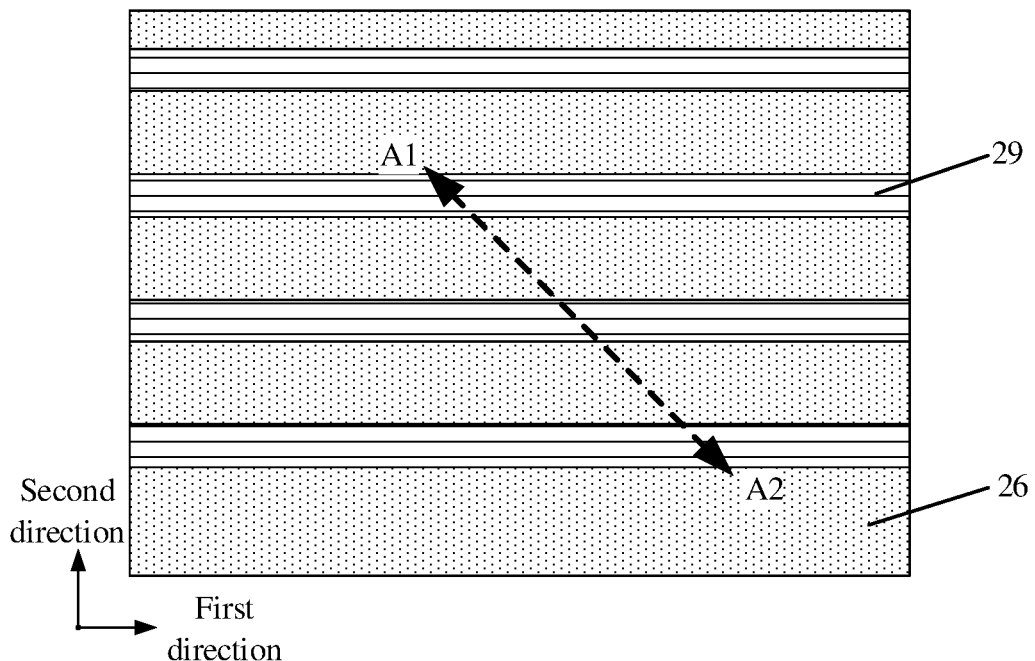
Figure 13B:
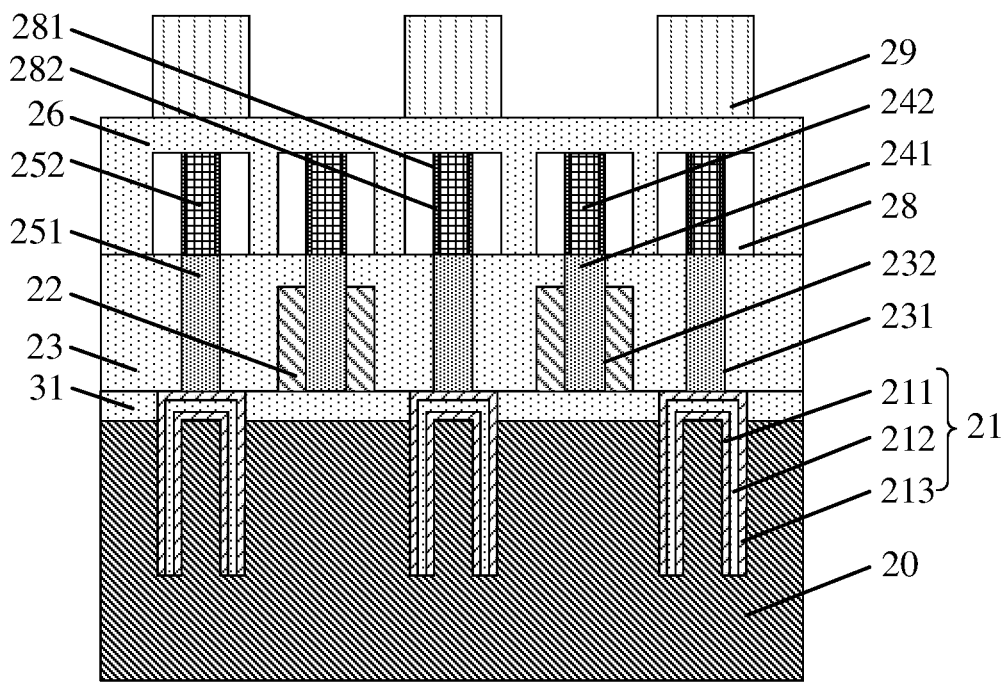

A plurality of second bit lines 29 extending in the first direction are formed on the second insulating layer 26, in which each of the plurality of second bit lines 29 at least covers the channel region 252 of a respective one of the plurality of first vertical transistors 25, as shown in FIG. 13A and FIG. 13B.

After the plurality of second bit lines 29 are formed, with reference to FIG. 14A to FIG. 16B, the operation that the second source/drain region 253 of each of the plurality of first vertical transistors 25 and the second source/drain region 243 of each of the plurality of second vertical transistors 24 are formed includes the following operations.

Figure 14A:
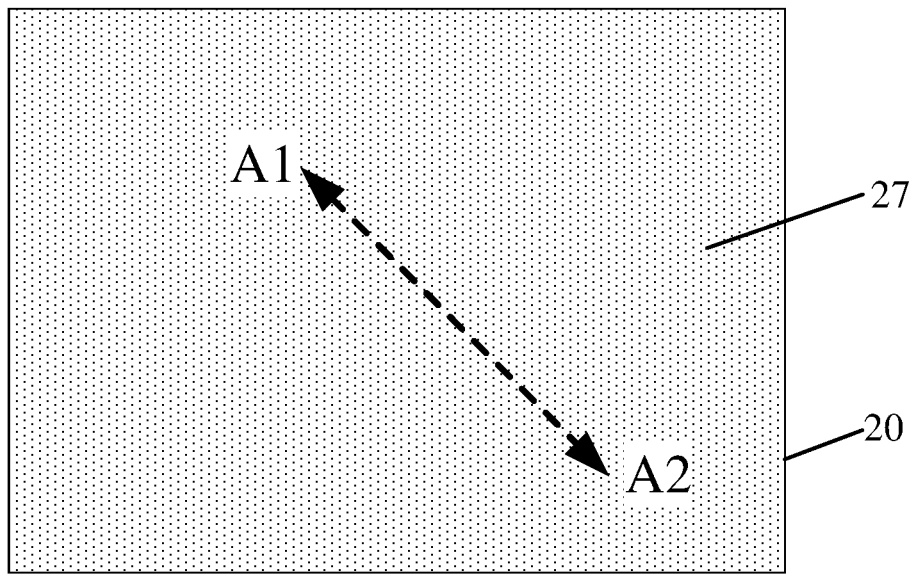
Figure 14B:
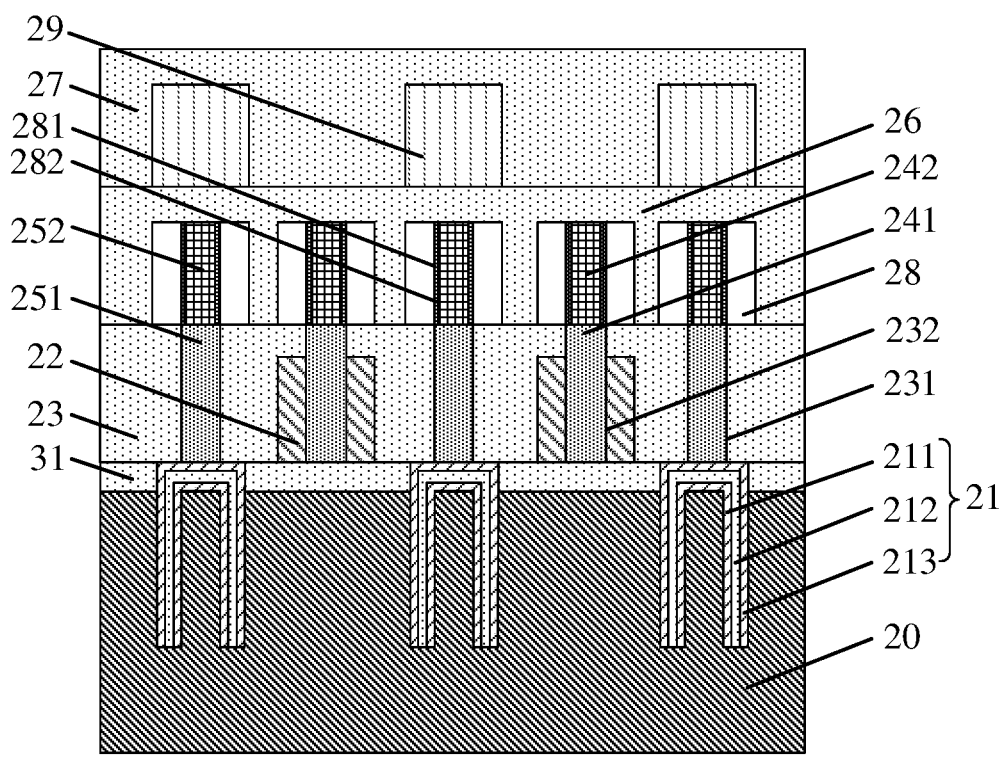

Firstly, a third insulating layer 27 is formed between the plurality of second bit lines 29 and above the plurality of second bit lines 29, as shown in FIG. 14A and FIG. 14B.

Figure 15A:
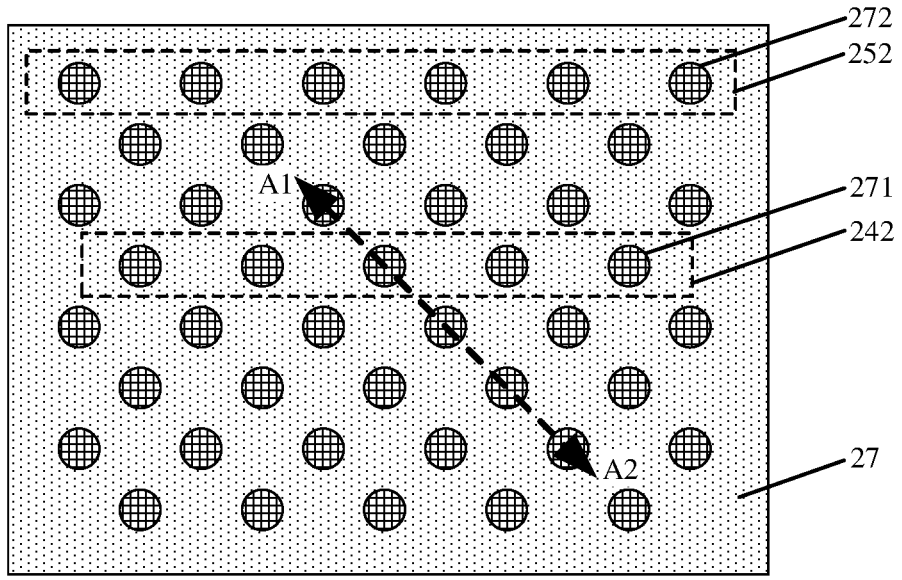
Figure 15B:
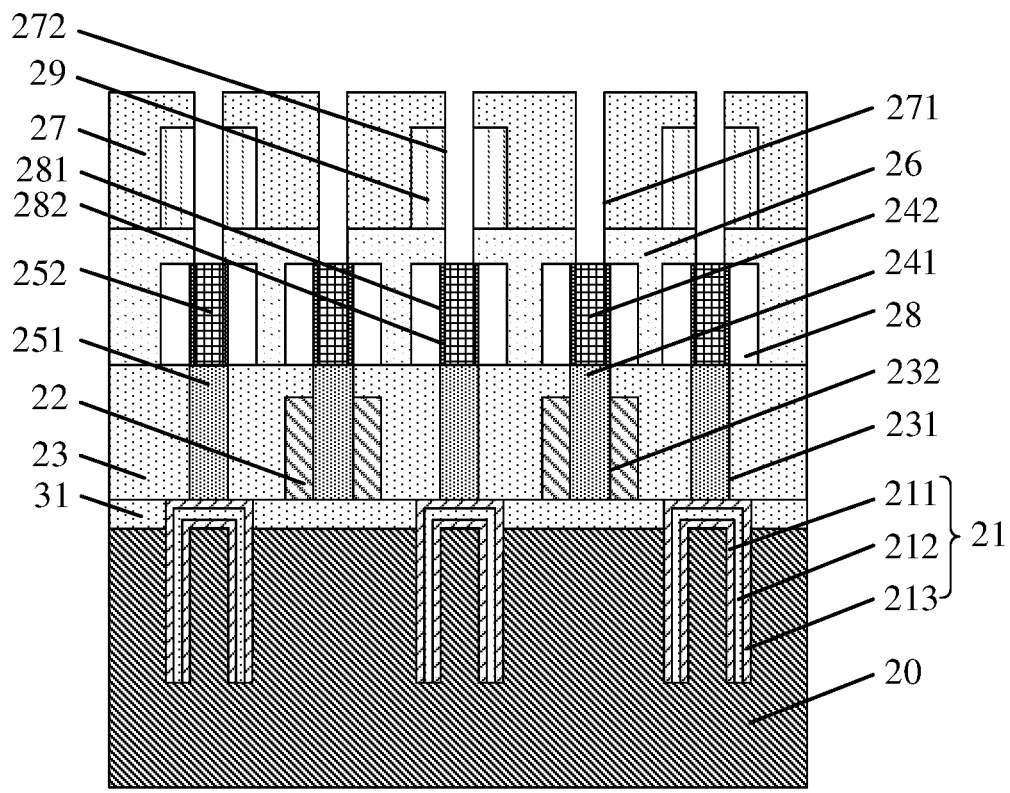

Then, the third insulating layer 27 arranged between the plurality of second bit lines 29 and the second insulating layer 26 arranged below the third insulating layer 27 are etched, so as to form a plurality of fourth through holes 271. The third insulating layer 27, the plurality of second bit lines 29 and the second insulating layer 26 are etched, so as to form a plurality of fifth through holes 272, as shown in FIG. 15A and FIG. 15B. It can be seen that each of the plurality of fifth through holes 272 is surrounded by a respective one of the plurality of second bit lines 29.

Figure 16A:
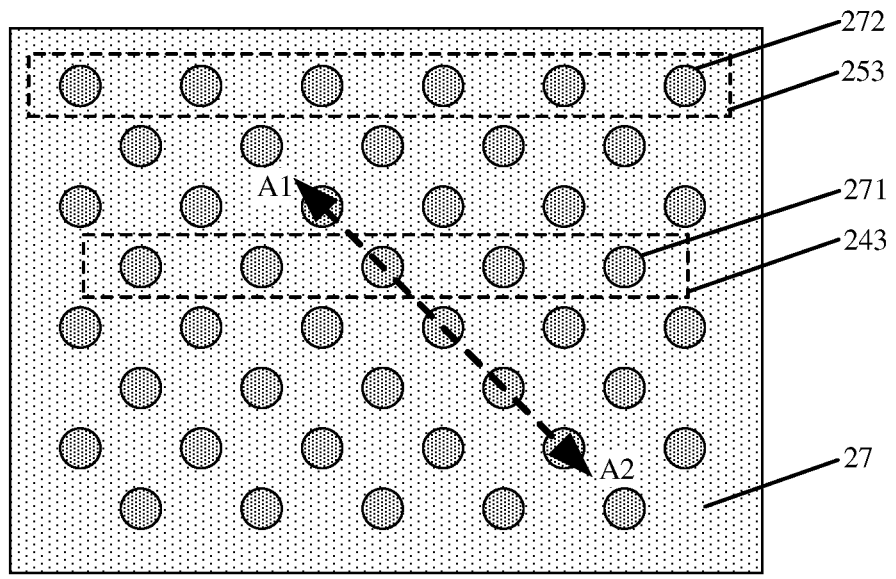
Figure 16B:
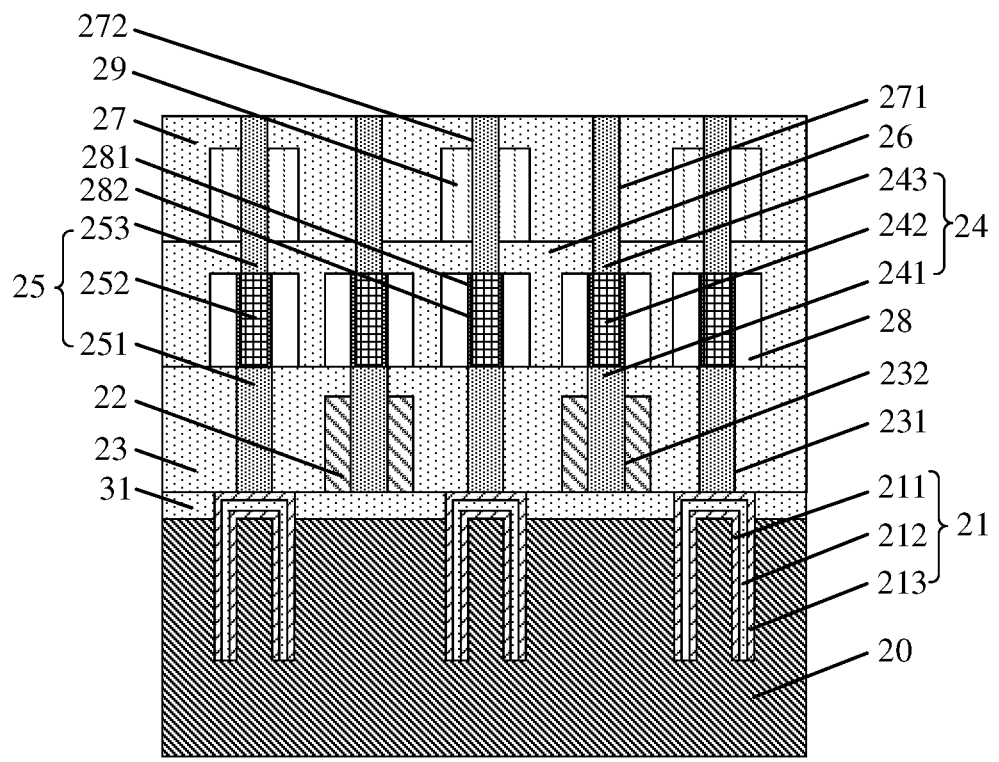

Finally, the second source/drain region 253 of each of the plurality of first vertical transistors 25 is formed in a respective one of the plurality of fifth through holes 272, and the second source/drain region 243 of each of the plurality of second vertical transistors 24 is formed in a respective one of the plurality of fourth through holes 271, as shown in FIG. 16A and FIG. 16B.

In some embodiments, the process of forming the fourth through holes 271 and the fifth through holes 272 by etching may be a dry etching process.

Herein, the fourth through hole 271 exposes the channel region 242 of the second vertical transistor 24, and the fifth through hole 272 exposes the channel region 252 of the first vertical transistor 25. That is, the channel region 242 of the second vertical transistor 24 finally formed is in direct contact with the second source/drain region 243 of the second vertical transistor 24, so as to form an electrical connection. The channel region 252 of the first vertical transistor 25 is in direct contact with the second source/drain region 253 of the first vertical transistor 25, so as to form an electrical connection.

As can be seen in combination with FIG. 16B, the fifth through hole 272 is surrounded by the second bit line 29, so that the second source/drain region 253 finally formed in the fifth through hole 272 is surrounded by the second bit line 29. That is, the second source/drain region 253 of the first vertical transistor 25 can be electrically connected to the second bit line 29 without bit line contact, which may effectively reduce the space occupation and improve the storage density.

The second source/drain regions 253 and 243 may be doped semiconductor materials. Specifically, the doped semiconductor material may include, but is not limited to, an N-type polysilicon material, a P-type polysilicon material, etc. In a specific embodiment, the material and the doping type of the second source/drain regions 253 and 243 are the same as the material and the doping type of the first source/drain regions 251 and 241. The formation process of the second source/drain regions 253 and 243 may be an epitaxial growth process. Optionally, the doping of the second source/drain regions 253 and 243 may be performed during the epitaxial growth or after the epitaxial growth is completed.

At this point, the plurality of first vertical transistors 25 and the plurality of second vertical transistors 24 are manufactured. Next, a plurality of second capacitors 33 are formed on the plurality of first vertical transistors 25 and the plurality of second vertical transistors 24.

With reference to FIG. 17A to FIG. 22B, S330 is executed, in which the plurality of second capacitors 33 are formed on the plurality of first vertical transistors 25 and the plurality of second vertical transistors 24. Each of the plurality of second capacitors 33 is electrically connected to a respective one of the plurality of second vertical transistors 24.

It should be noted that FIG. 17A to FIG. 22B show only one example of forming the second capacitors in the embodiment of the disclosure, and any method for forming the capacitor may be applied to the embodiment of the disclosure to form the second capacitors.

It can be understood that before the plurality of second capacitors 33 are formed, a second dielectric layer 32 may firstly be formed. The second dielectric layer 32 is at least formed above the second source/drain regions 253 of the plurality of first vertical transistors 25.

In some embodiments, the operation that the plurality of second capacitors 33 are formed includes the following operations.

Figure 17A:
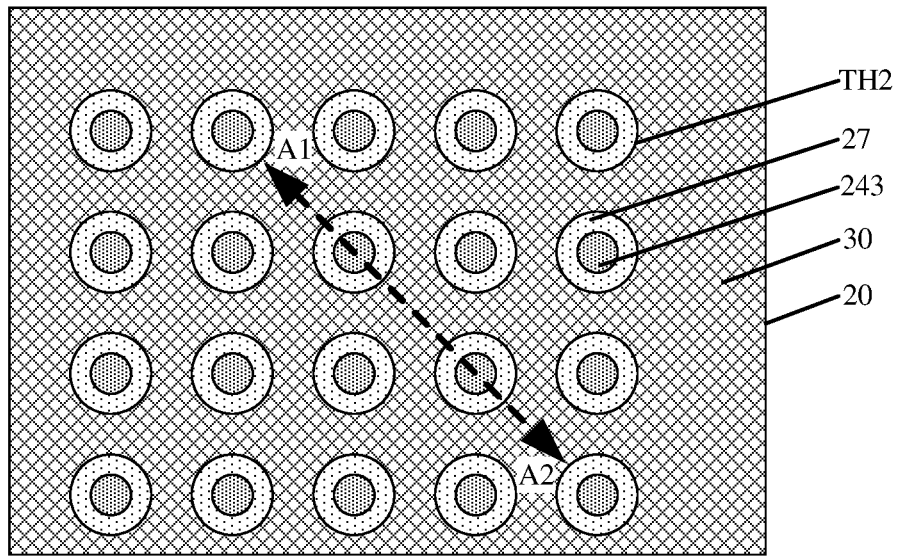
Figure 17B:
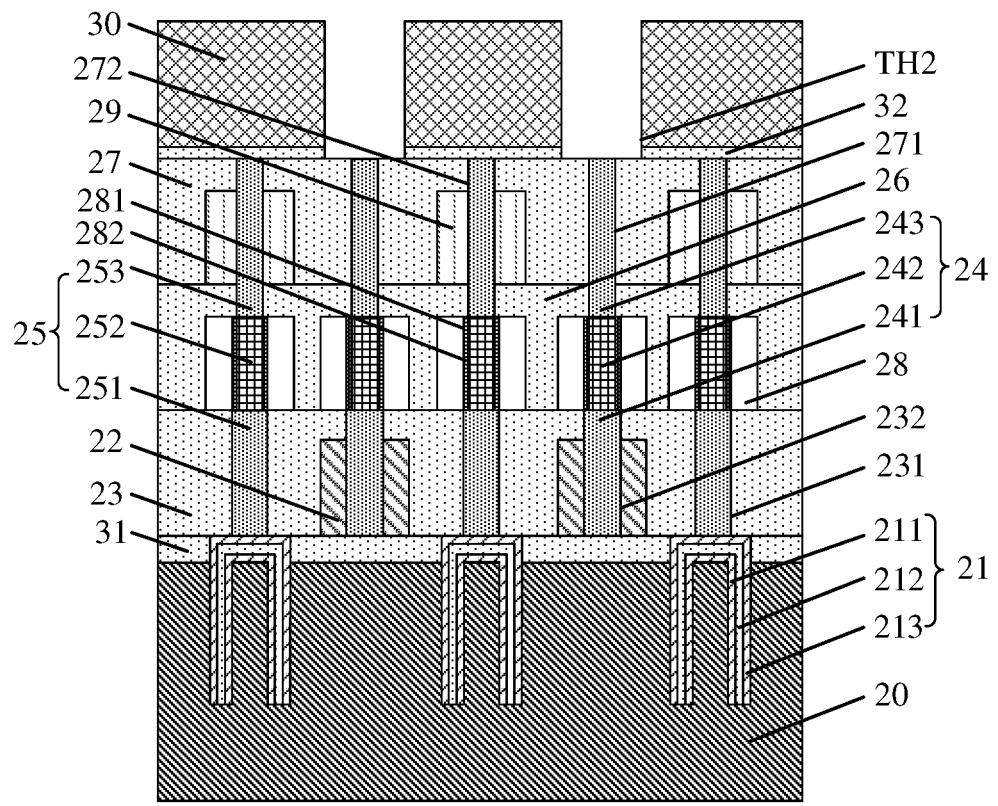

Firstly, as shown in FIG. 17A and FIG. 17B, a sacrificial layer 30 is formed above the plurality of first vertical transistors 25 and the plurality of second vertical transistors 24.

With reference to FIG. 17A and FIG. 17B, the sacrificial layer 30 is etched, so as to form a plurality of second trenches TH2 in the sacrificial layer 30. The second source/drain region 243 of each of the plurality of second vertical transistors 24 is exposed by a respective one of the plurality of second trenches TH2.

Figure 18A:
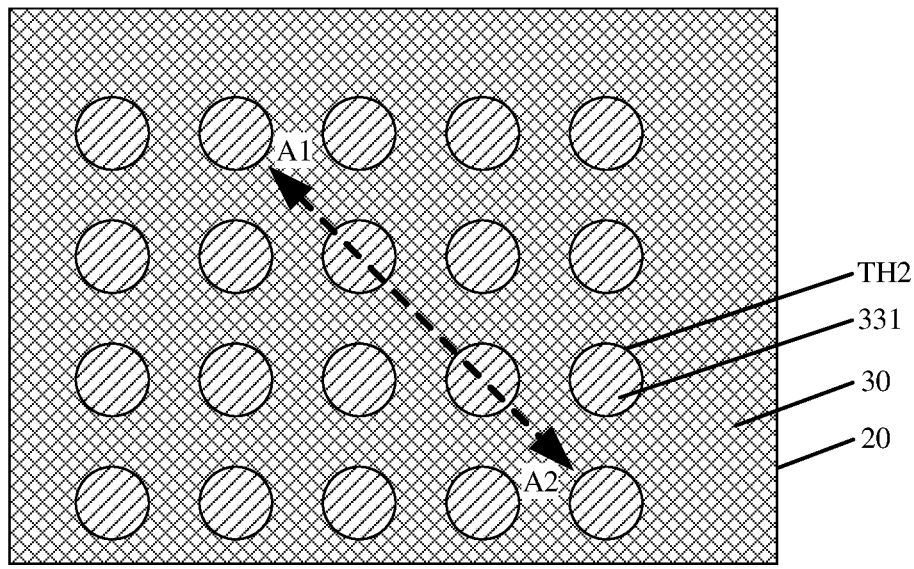
Figure 18B:
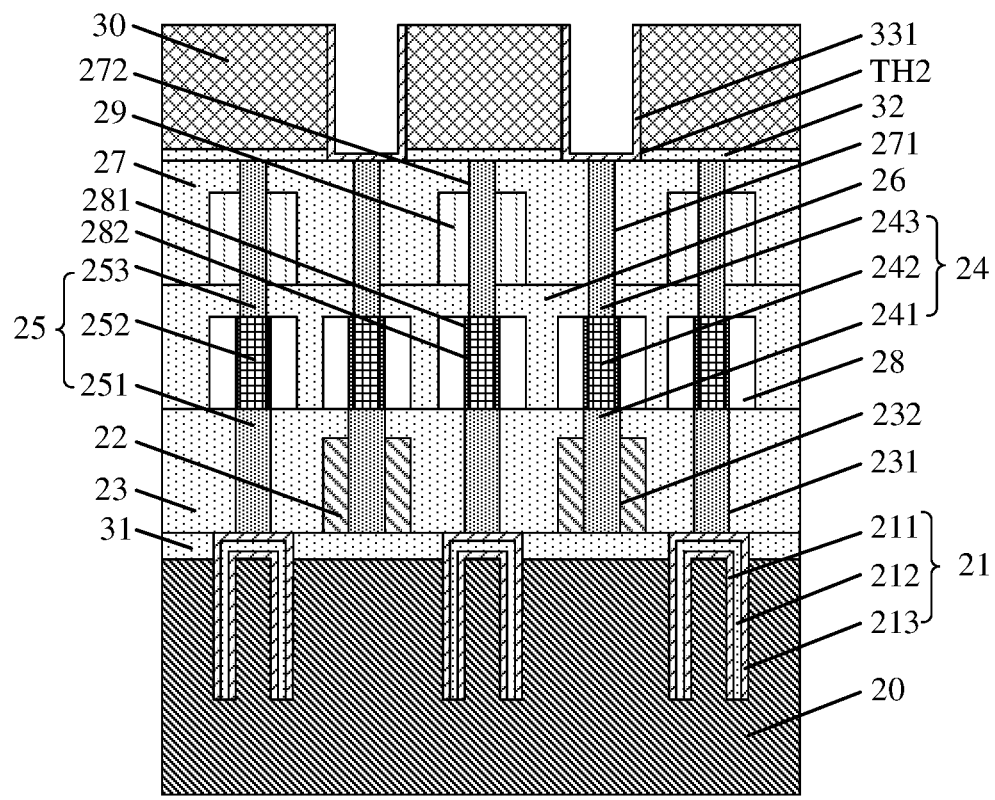

Next, as shown in FIG. 18A and FIG. 18B, a second lower electrode 331 is formed on a surface of each of the plurality of second trenches TH2.

Figure 19A:
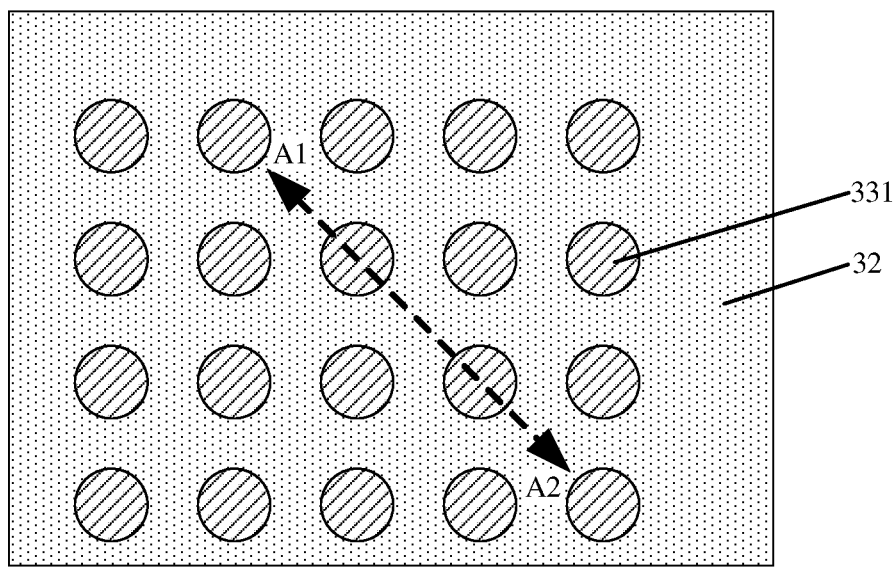
Figure 19B:
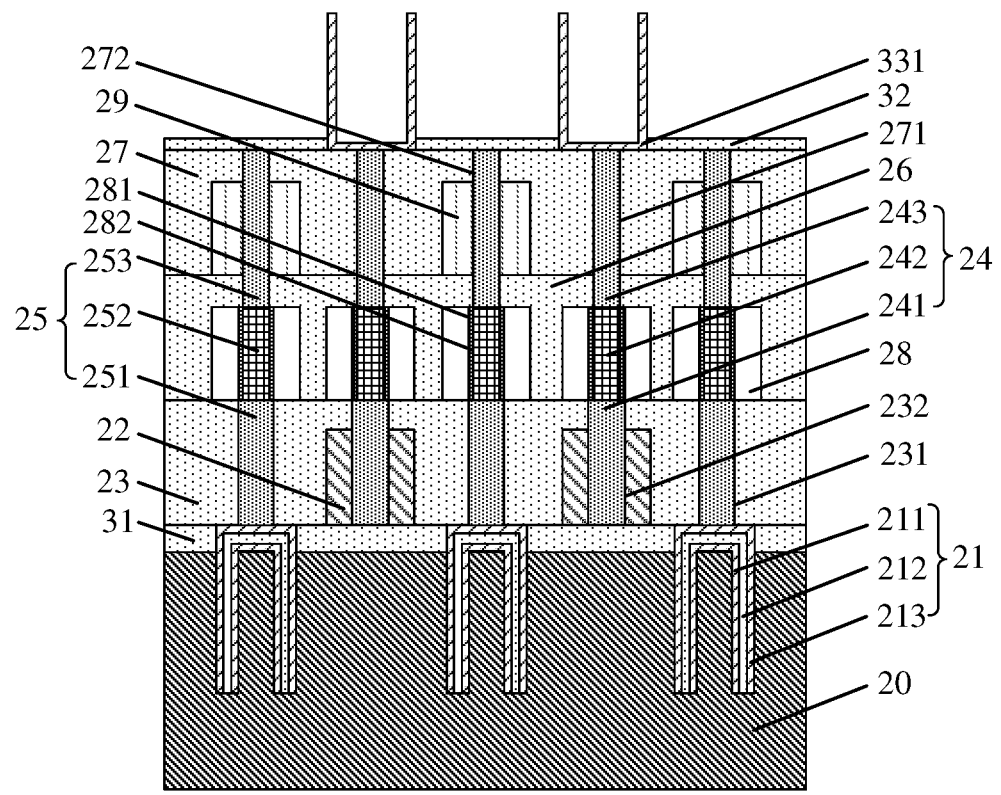

Then, as shown in FIG. 19A and FIG. 19B, the sacrificial layer 30 is removed.

Figure 20A:
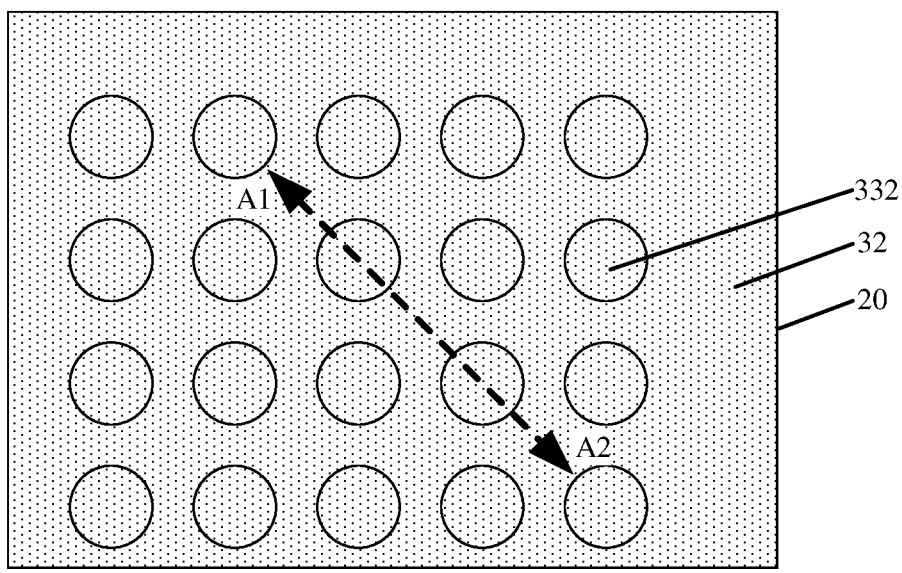
Figure 20B:
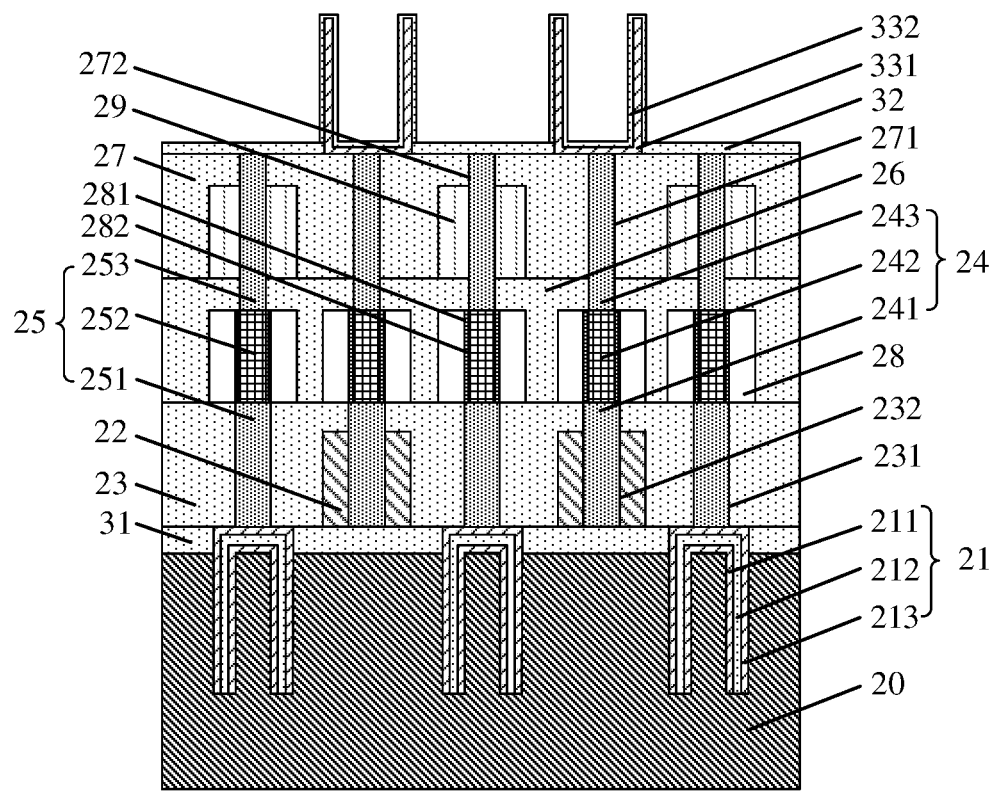

Next, an inner surface and an outer surface of the second lower electrode 331 are covered with a second dielectric material 332, as shown in FIG. 20A and FIG. 20B.

Figure 21A:
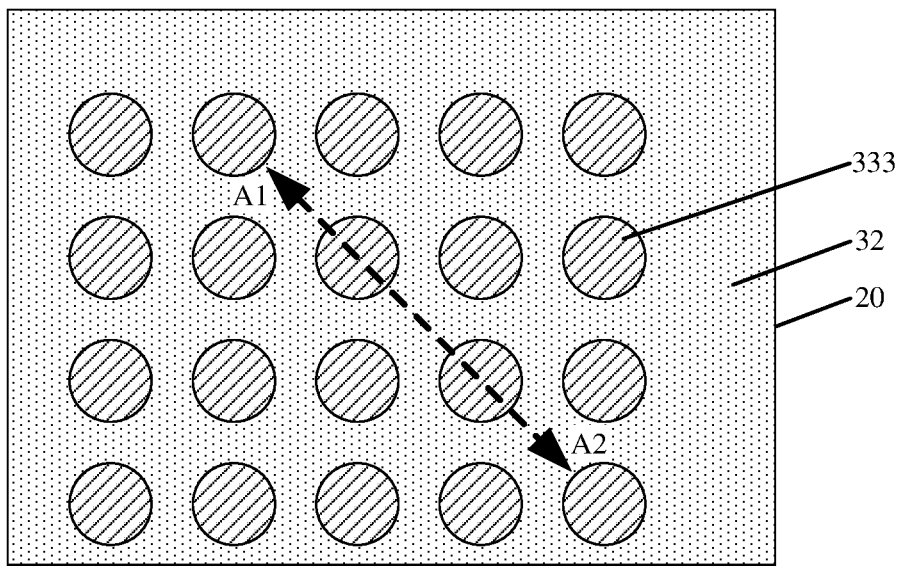
Figure 21B:
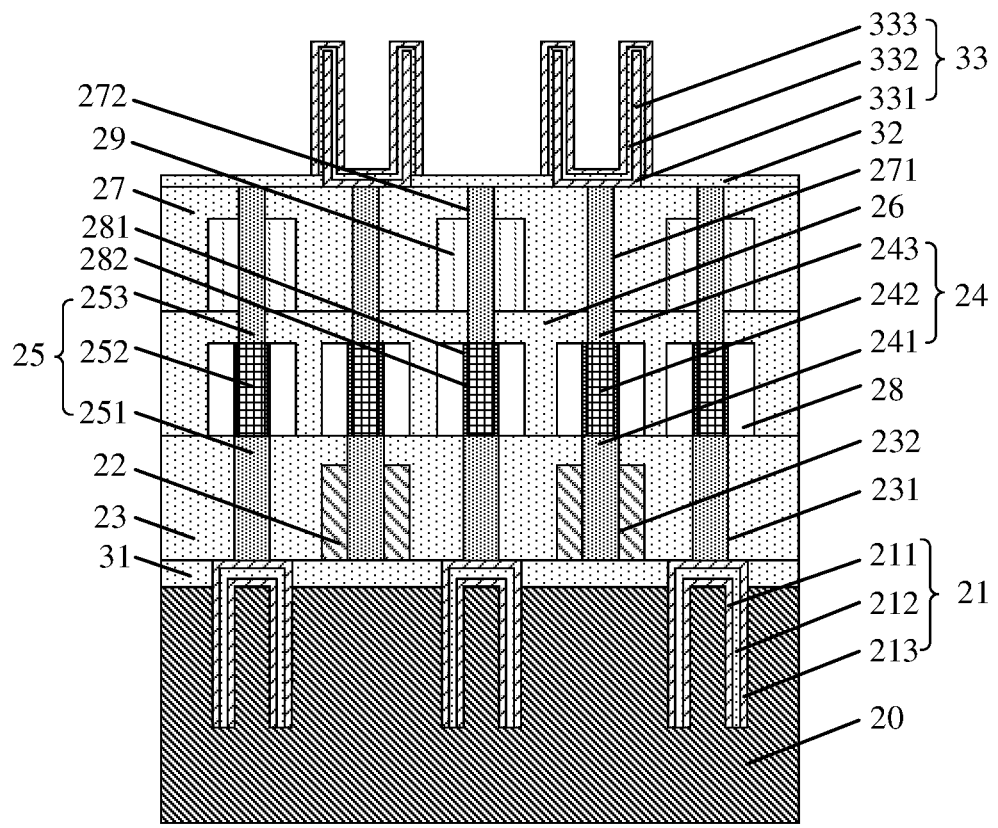

Finally, as shown in FIG. 21A and FIG. 21B, a second upper electrode 333 is formed on the second dielectric material 332. The operation of forming the plurality of second capacitors 33 is completed.

The materials of the second lower electrode 331 and the second upper electrode 333 may include one or more conductive materials, such as a doped semiconductor, a conductive metal nitride, metal, a metal silicide, a conductive oxide, or a combination thereof. For example, titanium nitride, tungsten, tantalum nitride, etc. It can be understood that the material of the second lower electrode 331 may be the same as or different from the material of the second upper electrode 333. The material of the second dielectric material 332 includes a nitride, an oxide, a metal oxide, or a combination thereof. For example, silicon nitride, silicon oxide, etc. In some embodiments, a high-K dielectric material may be used to improve the performance of the second capacitor 33.

The second capacitor 33 is electrically connected to the second vertical transistor 24. Specifically, the second capacitor 33 is in direct contact with the second source/drain region 243 of the second vertical transistor 24. Thus, the electrical connection may be directly performed without additional node contact, so that the transmission efficiency of stored information may be effectively improved. Meanwhile, the space occupation may be effectively reduced, and the storage density may be improved.

Figure 22A:
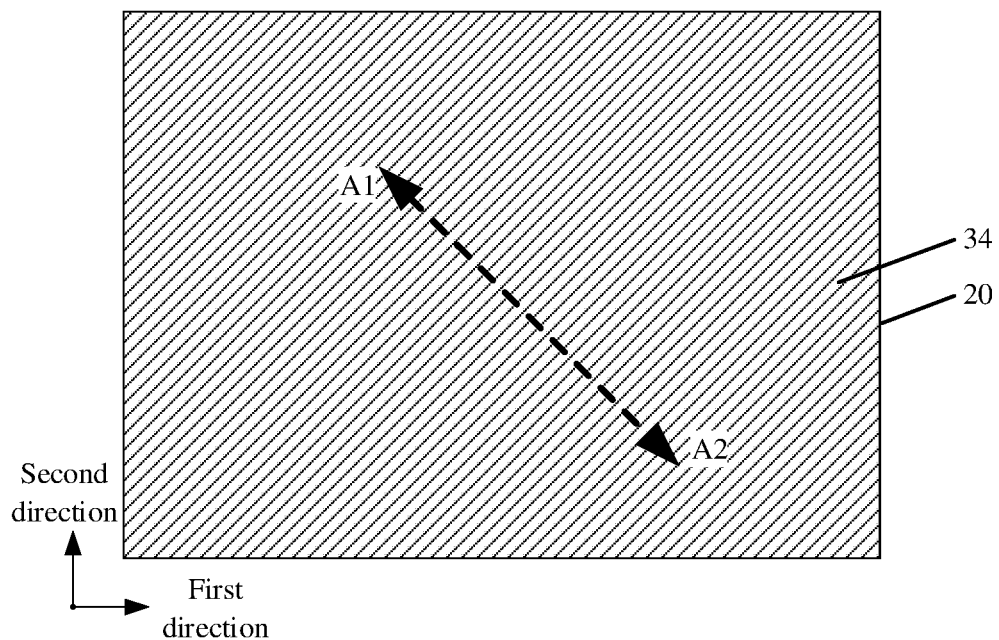
Figure 22B:
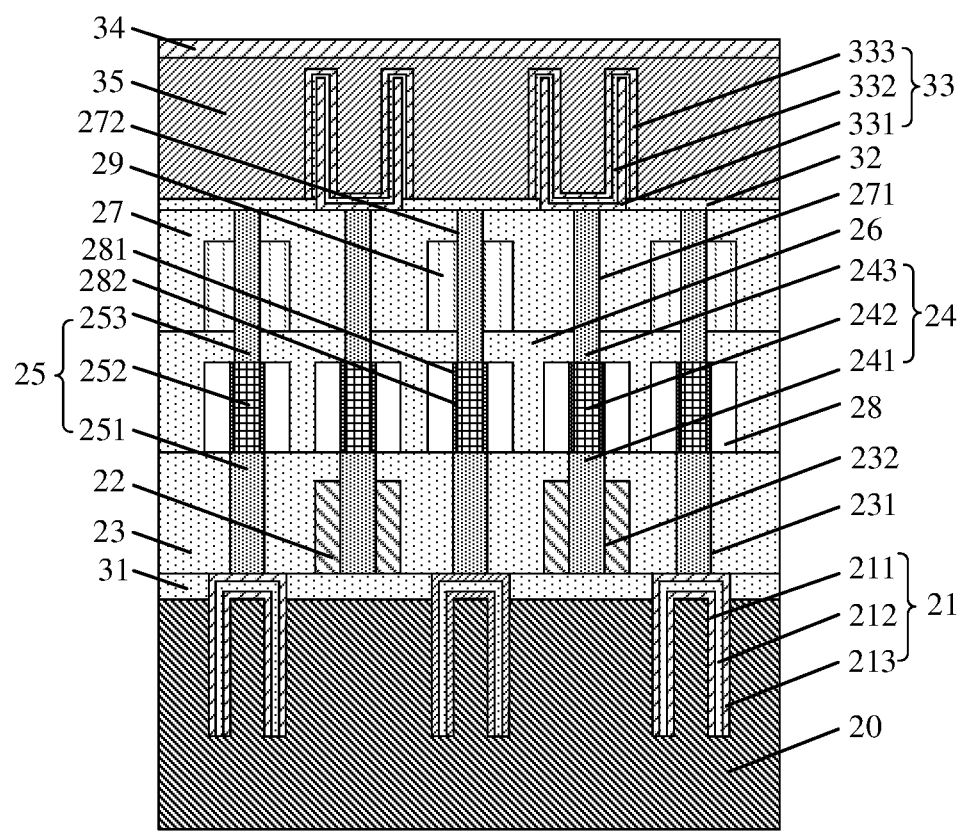

It can be understood that as shown in FIG. 22A and FIG. 22B, after the second capacitors 33 are formed, a planarization layer 35 may also be formed between and above the second capacitors 33. Specifically, the material for forming the planarization layer 35 may include, but is not limited to, polysilicon, etc.

Optionally, after the planarization layer 35 is formed, a plate layer 34 may also be formed above the planarization layer 35. The material for forming the plate layer 34 includes, but is not limited to, titanium nitride, etc.

In the embodiments of the disclosure, the second capacitors are arranged above the substrate, and the first capacitors are embedded in the substrate. The first capacitors and the second capacitors are arranged in different spaces, so that the arrangement of the first capacitors and the arrangement of the second capacitors do not interfere with each other. In some embodiments of the disclosure, the projections of the first capacitors on the substrate may partially overlap the projections of the second capacitors on the substrate. In this case, the vertical transistors arranged between the first capacitors and the second capacitors may be arranged more compactly. Thus, the number of memory cells per unit area of the memory device may be increased, so that the storage density is improved.

In addition, in the embodiments of the disclosure, the first vertical transistors and the second vertical transistors are vertically distributed, and the first vertical transistor is in direct contact with the first capacitor and the second bit line, and the second vertical transistor is in direct contact with the second capacitor and the first bit line, so that the bit line contact and the node contact are omitted. Thus, the transmission rate of stored information may be improved. Meanwhile, the space for a single memory cell may also be reduced, so that the storage density of the memory device is further improved.

The embodiments of the disclosure provide a memory device and a method for manufacturing a memory device. The memory device includes: a substrate, and a plurality of first capacitors embedded in the substrate; a plurality of first vertical transistors and a plurality of second vertical transistors, in which the plurality of first vertical transistors and the plurality of second vertical transistors are arranged on the substrate, and in which each of the plurality of first vertical transistors is electrically connected to a respective one of the plurality of first capacitors; and a plurality of second capacitors arranged on the plurality of first vertical transistors and the plurality of second vertical transistors, in which each of the plurality of second capacitors is electrically connected to a respective one of the plurality of second vertical transistors. The first capacitors and the second capacitors are placed in different spaces, so that the number of capacitors placed per unit area may be increased. Meanwhile, the transistors which are vertically distributed, that is, the first vertical transistors and the second vertical transistors, also increase the number of transistors placed per unit area. Therefore, the memory device provided by the embodiments of the disclosure may effectively increase the number of memory cells placed per unit area, so that the storage density is greatly improved.

It should be noted that the method for manufacturing the semiconductor device provided by the embodiments of the disclosure may be applied to a DRAM structure or other semiconductor devices, which is not excessively limited herein. The embodiment of the method for manufacturing the semiconductor device provided by the disclosure belongs to the same concept as the embodiment of the semiconductor device. The technical features in the technical solutions described in each embodiment may be arbitrarily combined without conflict.

The above is only the preferred embodiments of the disclosure, and is not intended to limit the protection scope of the disclosure. Any modifications, equivalent substitution, improvements made within the spirit and principle of the disclosure shall fall within the protection scope of the disclosure.

The invention claimed is:

1. A memory device, comprising:
a substrate, and a plurality of first capacitors embedded in the substrate;
a plurality of first vertical transistors and a plurality of second vertical transistors, wherein the plurality of first vertical transistors and the plurality of second vertical transistors are arranged on the substrate, and wherein each of the plurality of first vertical transistors is electrically connected to a respective one of the plurality of first capacitors, wherein each of the plurality of first vertical transistors comprises a first source/drain region, a channel region and a second source/drain region which are arranged from bottom to top, and each of the plurality of second vertical transistors comprises a first source/drain region, a channel region and a second source/drain region which are arranged from bottom to top, wherein the first source/drain region of each of the plurality of first vertical transistors is electrically connected to the respective one of the plurality of first capacitors, and the second source/drain region of each of the plurality of second vertical transistors is electrically connected to a respective one of the plurality of second capacitors; and
a plurality of second capacitors arranged on the plurality of first vertical transistors and the plurality of second vertical transistors, wherein each of the plurality of second capacitors is electrically connected to a respective one of the plurality of second vertical transistors;
a plurality of first bit lines extending in a first direction, wherein each of the plurality of first bit lines is arranged on the substrate and arranged around the first source/drain region of a respective one of the plurality of second vertical transistors, and the first source/drain region of a respective one of the plurality of second vertical transistors penetrates through a respective one of the plurality of first bit lines;
a plurality of second bit lines extending in the first direction, wherein each of the plurality of second bit lines is arranged around the second source/drain region of a respective one of the plurality of first vertical transistors, and the second source/drain region of a respective one of the plurality of first vertical transistors penetrates through a respective one of the plurality of second bit lines.

2. The memory device according to claim 1, wherein projections of the plurality of first capacitors on the substrate partially overlap projections of the plurality of second capacitors on the substrate.

3. The memory device according to claim 1, further comprising:
a first insulating layer arranged between the plurality of first bit lines and covering the plurality of first bit lines;
a plurality of first through holes arranged between the plurality of first bit lines and penetrating through the first insulating layer, wherein the first source/drain region of each of the plurality of first vertical transistors is provided in a respective one of the plurality of first through holes; and a plurality of second through holes, wherein each of the plurality of second through holes penetrates through the first insulating layer and a respective one of the plurality of first bit lines, and the first source/drain region of each of the plurality of second vertical transistors is provided in a respective one of the plurality of second through holes.

4. The memory device according to claim 1, further comprising:
a plurality of word lines arranged above the plurality of first bit lines and extending in a second direction, wherein each of the plurality of word lines is provided with a plurality of third through holes, the channel region of each of the plurality of first vertical transistors is provided in a respective one of the plurality of third through holes, and the channel region of each of the plurality of second vertical transistors is provided in a respective one of the plurality of third through holes.

5. The memory device according to claim 4, further comprising:
a gate dielectric layer covering a sidewall of each of the plurality of third through holes.

6. The memory device according to claim 4, wherein the plurality of second bit lines are arranged above the plurality of word lines.

7. The memory device according to claim 6, further comprising:
a second insulating layer arranged between the plurality of word lines and covering the plurality of word lines;

a third insulating layer arranged between the plurality of second bit lines and covering the plurality of second bit lines;

a plurality of fourth through holes, wherein each of the plurality of fourth through holes is arranged between two adjacent second bit lines of the plurality of second bit lines, and each of the plurality of fourth through holes penetrates through the third insulating layer and the second insulating layer to expose the channel region of each of the plurality of second vertical transistors, and the second source/drain region of each of the plurality of second vertical transistors is provided in a respective one of the plurality of fourth through holes; and a plurality of fifth through holes, wherein each of the plurality of fifth through holes penetrates through the third insulating layer, a respective one of the plurality of second bit lines and the second insulating layer to expose the channel region of each of the plurality of first vertical transistors, and the second source/drain region of each of the plurality of first vertical transistors is provided in a respective one of the plurality of fifth through holes.

8. A method for manufacturing a memory device, comprising:

embedding a plurality of first capacitors in a substrate;

forming, on the substrate, a plurality of first bit lines extending in a first direction;

forming a plurality of first vertical transistors and a plurality of second vertical transistors on the substrate, wherein each of the plurality of first vertical transistors is electrically connected to a respective one of the plurality of first capacitors;

forming a plurality of second bit lines extending in the first direction; and forming a plurality of second capacitors on the plurality of first vertical transistors and the plurality of second vertical transistors, wherein each of the plurality of second capacitors is electrically connected to a respective one of the plurality of second vertical transistors;

wherein each of the plurality of first vertical transistors comprises a first source/drain region, a channel region and a second source/drain region which are arranged from bottom to top, and each of the plurality of second vertical transistors comprises a first source/drain region, a channel region and a second source/drain region which are arranged from bottom to top, wherein the first source/drain region of each of the plurality of first vertical transistors is electrically connected to the respective one of the plurality of first capacitors, and the second source/drain region of each of the plurality of second vertical transistors is electrically connected to a respective one of the plurality of second capacitors;

wherein each of the plurality of first bit lines is arranged on the substrate and arranged around the first source/drain region of a respective one of the plurality of second vertical transistors, and the first source/drain region of a respective one of the plurality of second vertical transistors penetrates through a respective one of the plurality of first bit lines;

wherein each of the plurality of second bit lines is arranged around the second source/drain region of a respective one of the plurality of first vertical transistors, and the second source/drain region of a respective one of the plurality of first vertical transistors penetrates through a respective one of the plurality of second bit lines.

9. The method for manufacturing the memory device according to claim 8, wherein embedding the plurality of first capacitors in the substrate comprises:

etching the substrate to form a plurality of first trenches in the substrate;

forming a first lower electrode in each of the plurality of first trenches;

covering a surface of the first lower electrode with a first dielectric material; and forming a first upper electrode on the first dielectric material.

10. The method for manufacturing the memory device according to claim 8, wherein forming the plurality of first vertical transistors and the plurality of second vertical transistors on the substrate comprises:

forming the first source/drain region of each of the plurality of first vertical transistors and the first source/drain region of each of the plurality of second vertical transistors on the substrate, wherein the first source/drain region of each of the plurality of first vertical transistors is electrically connected to the respective one of the plurality of first capacitors, and the first source/drain region of each of the plurality of second vertical transistors is electrically connected to a respective one of the plurality of first bit lines;

forming a channel region on the first source/drain region of each of the plurality of first vertical transistors, and forming a channel region on the first source/drain region of each of the plurality of second vertical transistors; and forming the second source/drain region on the channel region of each of the plurality of first vertical transistors, and forming the second source/drain region on the channel region of each of the plurality of second vertical transistors.

11. The method for manufacturing the memory device according to claim 10, wherein forming the first source/drain region of each of the plurality of first vertical transistors and the first source/drain region of each of the plurality of second vertical transistors on the substrate comprises:

forming a first insulating layer between the plurality of first bit lines and above the plurality of first bit lines;

etching the first insulating layer arranged between the plurality of first bit lines to form a plurality of first through holes, wherein each of the plurality of first capacitors is exposed by a respective one of the plurality of first through holes; and etching the first insulating layer and the plurality of first bit lines arranged below the first insulating layer to form a plurality of second through holes; and forming the first source/drain region of each of the plurality of first vertical transistors in a respective one of the plurality of first through holes, and forming the first source/drain region of each of the plurality of second vertical transistors in a respective one of the plurality of second through holes.

12. The method for manufacturing the memory device according to claim 10, wherein before forming the channel region on the first source/drain region of each of the plurality of first vertical transistors and forming the channel region on the first source/drain region of each of the plurality of second vertical transistors, the method further comprises:

forming a plurality of word lines above a first insulating layer, wherein the first source/drain region of each of the plurality of first vertical transistors is covered with a respective one of the plurality of word lines, and the first source/drain region of each of the plurality of second vertical transistors is covered with a respective one of the plurality of word lines.

13. The method for manufacturing the memory device according to claim 12, wherein
forming the channel region on the first source/drain region of each of the plurality of first vertical transistors and forming the channel region on the first source/drain region of each of the plurality of second vertical transistors comprises:
etching the plurality of word lines to form a plurality of third through holes, wherein the first source/drain region of each of the plurality of first vertical transistors is exposed by a respective one of the plurality of third through holes, and the first source/drain region of each of the plurality of second vertical transistors is exposed by a respective one of the plurality of third through holes; and
forming the channel region of each of the plurality of first vertical transistors in a respective one of the plurality of third through holes, and forming the channel region of each of the plurality of second vertical transistors in a respective one of the plurality of third through holes.

14. The method for manufacturing the memory device according to claim 13, wherein
before forming the channel region of each of the plurality of first vertical transistors in the respective one of the plurality of third through holes and forming the channel region of each of the plurality of second vertical transistors in the respective one of the plurality of third through holes, the method further comprises:
forming a gate dielectric layer on a sidewall of each of the plurality of third through holes.

15. The method for manufacturing the memory device according to claim 12, wherein
before forming the second source/drain region on the channel region of each of the plurality of first vertical transistors and forming the second source/drain region on the channel region of each of the plurality of second vertical transistors, the method further comprises:
forming a second insulating layer between the plurality of word lines and above the plurality of word lines; and
forming, on the second insulating layer, a plurality of second bit lines extending in the first direction, wherein each of the plurality of second bit lines at least covers the channel region of a respective one of the plurality of first vertical transistors.

16. The method for manufacturing the memory device according to claim 15, wherein
forming the second source/drain region on the channel region of each of the plurality of first vertical transistors and forming the second source/drain region on the channel region of each of the plurality of second vertical transistors comprises:
forming a third insulating layer between the plurality of second bit lines and above the plurality of second bit lines;
etching the second insulating layer and the third insulating layer arranged between the plurality of second bit lines to form a plurality of fourth through holes, wherein the channel region of each of the plurality of second vertical transistors is exposed by a respective one of the plurality of fourth through holes; etching the third insulating layer, the plurality of second bit lines and the second insulating layer to form a plurality of fifth through holes, wherein the channel region of each of the plurality of first vertical transistors is exposed by a respective one of the plurality of fifth through holes; and
forming the second source/drain region of each of the plurality of second vertical transistors in a respective one of the plurality of fourth through holes, and forming the second source/drain region of each of the plurality of first vertical transistors in a respective one of the plurality of fifth through holes.

17. The method for manufacturing the memory device according to claim 8, wherein
forming the plurality of second capacitors comprises:
forming a sacrificial layer on the plurality of first vertical transistors and the plurality of second vertical transistors;
etching the sacrificial layer to form a plurality of second trenches in the sacrificial layer;
covering a surface of each of the plurality of second trenches with a second lower electrode;
removing the sacrificial layer;
covering an inner surface and an outer surface of the second lower electrode with a second dielectric material; and
forming a second upper electrode on the second dielectric material.

* * * * *